[12] United States Patent
Roy, Jr. et al.

(10) Patent No.: US 12,259,418 B2
(45) Date of Patent: Mar. 25, 2025

(54) LOW-FREQUENCY TRANSMISSION MONITORING SYSTEM WITH FIXED AND MOBILE METERING DEVICES

(71) Applicant: CPG Technologies, LLC, Italy, TX (US)

(72) Inventors: Charles M. Roy, Jr., Waco, TX (US); Kendol C. Everroad, Midlothian, TX (US)

(73) Assignee: CPG Technologies, LLC, Waco, TX (US)

(*) Notice: Subject to any disclaimer, the term of this patent is extended or adjusted under 35 U.S.C. 154(b) by 288 days.

(21) Appl. No.: 17/897,052

(22) Filed: Aug. 26, 2022

(65) Prior Publication Data

US 2022/0404411 A1 Dec. 22, 2022

Related U.S. Application Data

(63) Continuation-in-part of application No. 16/796,074, filed on Feb. 20, 2020, now Pat. No. 11,448,677.

(60) Provisional application No. 63/296,314, filed on Jan. 4, 2022.

(51) Int. Cl.
*G01R 29/08* (2006.01)
*H02J 50/20* (2016.01)

(52) U.S. Cl.
CPC ............. *G01R 29/08* (2013.01); *H02J 50/20* (2016.02)

(58) Field of Classification Search
CPC . G01R 29/0892; G01R 33/0023; G01R 29/14

USPC ......................................................... 324/260
See application file for complete search history.

(56) References Cited

U.S. PATENT DOCUMENTS

| | | | | |
|---|---|---|---|---|
| 9,899,718 | B2* | 2/2018 | Corum | H02J 50/20 |
| 10,031,208 | B2* | 7/2018 | Lilly | G01S 5/0294 |
| 10,408,916 | B2* | 9/2019 | Corum | G01S 5/06 |
| 2016/0079753 | A1* | 3/2016 | Corum | H02J 50/402 |
| | | | | 307/149 |
| 2016/0079754 | A1* | 3/2016 | Corum | H02J 3/00 |
| | | | | 333/248 |
| 2016/0111890 | A1* | 4/2016 | Corum | H02J 50/20 |
| | | | | 307/104 |
| 2017/0005529 | A1* | 1/2017 | Burling | H01Q 13/26 |
| 2017/0078037 | A1* | 3/2017 | Corum | H02J 50/40 |
| 2018/0175630 | A1* | 6/2018 | Lilly | G08B 13/2405 |

* cited by examiner

*Primary Examiner* — Christopher P McAndrew
(74) *Attorney, Agent, or Firm* — Global IP Group, PLLC

(57) ABSTRACT

A transmission measurement system for a guided surface wave transmitted by a guided surface waveguide probe, wherein the transmission measurement system includes at least one mobile metering device configured with a mobile 3-axis antenna and a plurality of sensing subsystems to continuously sense and measure a plurality of meter measurement data while being conveyed by a ground-based or airborne vehicle, the plurality of meter measurement data include but is not limited to the electromagnetic field strength of the guided surface wave, the weather and atmospheric conditions local to the mobile metering device, and soil sigma measurements selected from at least estimated soil sigma measurements and direct soil sigma measurements along the path of the mobile metering device.

20 Claims, 11 Drawing Sheets

| Configuration Data 196 | |
|---:|:---|
| Name of Test: | 150KHz Test on 1-1-2019 |
| Trace Center Frequency: | 150KHz |
| Trace Span: | 10KHz |
| Resolution Bandwidth: | 1.99 Hz |
| Reference Level: | 52 mV/m |
| Units: | mV/m |
| Deg CCW from True N: | 42 |
| Preamp/Filter State: | ON |

LOW-FREQUENCY TRANSMISSION MONITORING SYSTEM WITH FIXED AND MOBILE METERING DEVICES

CROSS REFERENCE TO RELATED APPLICATIONS

This application is a continuation-in-part of U.S. application Ser. No. 16/796,074, filed on Feb. 20, 2020, and titled "SYSTEM AND METHOD FOR MEASURING FIELDS OVER DISTANCE," and claims the benefit of U.S. Provisional Application No. 63/296,314, filed Jan. 4, 2022, and titled "LOW-FREQUENCY TRANSMISSION MONITORING SYSTEM WITH FIXED AND MOBILE METERING DEVICES," which are herein incorporated by reference in their entireties.

BACKGROUND

For over a century, signals transmitted by radio waves involved radiation fields launched using conventional antenna structures. In contrast to radio science, electrical power distribution systems in the last century involved the transmission of energy guided along electrical conductors. This understanding of the distinction between radio frequency (RF) and power transmission has existed since the early 1900's.

BRIEF DESCRIPTION OF THE DRAWINGS

For a more complete understanding of the embodiments and the advantages thereof, reference is now made to the following description, in conjunction with the accompanying figures briefly described below. The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

FIG. 9 illustrates a data structure example of configuration data used to configure a metering device according to various embodiments of the present disclosure.

DETAILED DESCRIPTION

Figure 1:
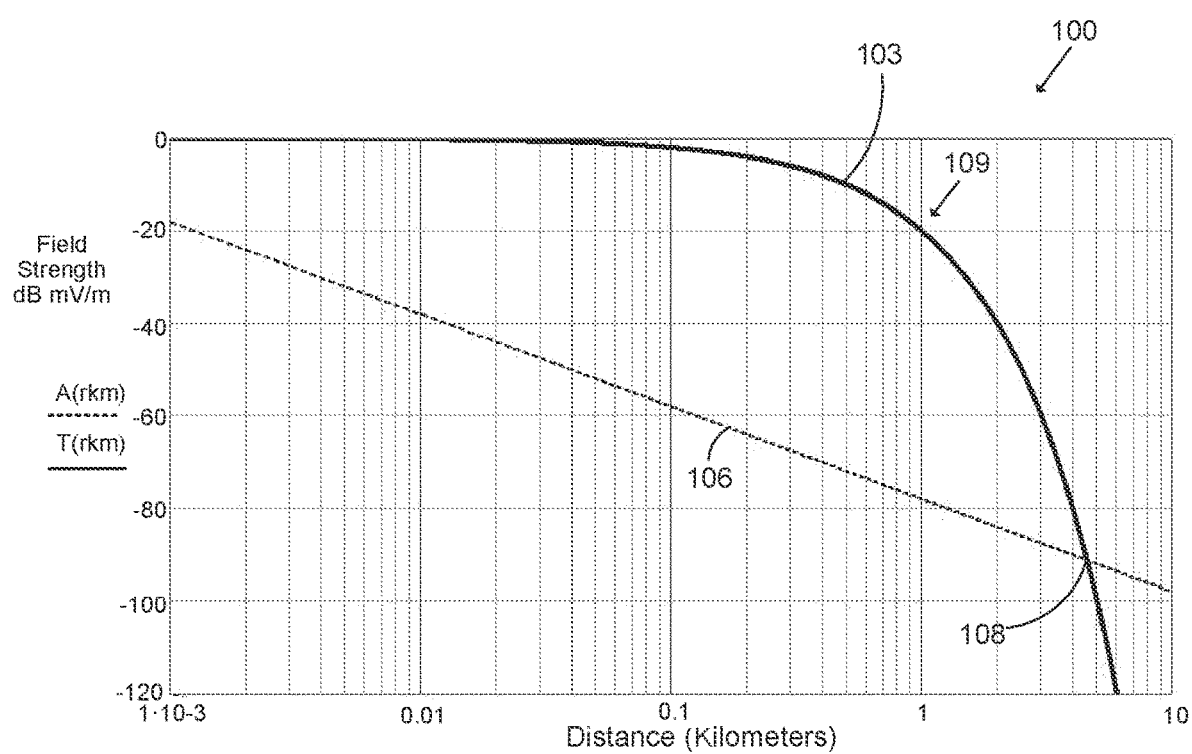
FIG. 1 is a graph that shows examples of electromagnetic field strength over distance of a radiation wave and a guided surface wave.

The following terminology is used for clarity in the discussion that follows. First, a clear distinction is useful as between a radiated electromagnetic field and guided electromagnetic field such as a guided surface wave.

A radiated electromagnetic field comprises electromagnetic energy that is emitted from a source structure in the form of waves that are not bound to a waveguide. For example, a radiated electromagnetic field is generally an electromagnetic field that leaves an electric structure such as a radio antenna and propagates through the atmosphere or other medium without being guided or bound to any waveguide structure. Once radiated electromagnetic waves leave the electric structure such as a transmitting antenna, the waves propagate through the medium of propagation (e.g., air) independent of the transmission source until energy in the wave eventually dissipates. The radiating wave propagates and dissipates whether the transmission source continues transmitting or not.

Once electromagnetic waves are radiated, they are not recoverable unless intercepted, and if not intercepted the energy inherent in radiated electromagnetic waves is lost forever. Electrical structures such as transmitting antennas are designed to radiate electromagnetic fields by maximizing the ratio of the radiation resistance to the structure loss resistance. Radiated energy spreads out in space and propagates until it dissipates whether a receiver is present or not. This is why radiated electromagnetic waves require a constant supply of power from the transmission source if the transmission is to continue and if the radiating waves are to reach a desired distance at a desired electromagnetic field strength. The energy density of the radiated electromagnetic fields is a function of distance due to geometric spreading. Accordingly, the term "radiate" in all its forms as used herein refers to this form of electromagnetic propagation.

A guided electromagnetic field is a propagating electromagnetic wave whose energy is concentrated within or near boundaries between media having different electromagnetic properties. In this sense, a guided electromagnetic field is one that is bound to a waveguide and may be characterized as being conveyed by the current flowing in the waveguide. If there is no load to receive and/or dissipate the energy conveyed in a guided electromagnetic wave, then no energy is lost except for that dissipated in the conductivity of the guiding medium. Stated another way, if there is no load for a guided electromagnetic wave, then no energy is consumed. The transmission source generating a guided electromagnetic field does not deliver real power unless a resistive load is present. For this reason, the transmission source essentially idles until a load is presented. This is similar to running a generator producing a 60 Hertz electromagnetic wave over a power line where there is no electrical load on the power line. For a guided electromagnetic field or guided electromagnetic wave, this is referred to as "transmission line mode." Further, guided electromagnetic energy does not continue to propagate along a finite length waveguide after the energy source is turned off. Accordingly, the term "guide" in all its forms as used herein refers to this transmission mode of electromagnetic propagation.

A guided surface wave is an inhomogeneous wave that has a phase velocity greater than the speed of light c. The guided surface wave is the only known surface wave that has a phase velocity greater than the speed of light c. The guided surface wave is inhomogeneous in that it is a transverse magnetic wave that includes both a vertical electric field component oriented in the vertical direction and a horizontal electric field component that is oriented in the direction of propagation of the guided surface wave. Stated another way, an inhomogeneous plane wave is one in which the planes of constant phase (normal to the interface) and the planes of constant amplitude (parallel to the interface) do not coincide. The vertical electric field component of a guided surface wave is vertically polarized and decays exponentially as a function of height.

This contrasts with a radiated electromagnetic wave which is a homogeneous wave in that it has a vertical electric field component and a transverse magnetic field component, where both the electric and magnetic field components fall in a single plane. Accordingly, a radiated electromagnetic wave is also known as a transverse electromagnetic wave.

In some examples described herein, a guided surface wave monitoring system may comprise a mobile metering device having a plurality of measurement subsystems configured to obtain and locally store a plurality of meter measurement data indicative of and/or relevant to a guided surface wave transmitted by a guided surface waveguide probe, wherein the plurality of meter measurement data include a plurality of electromagnetic field measurements, a plurality of weather sensing data, at least one of a plurality of soil sigma measurements selected from an estimated soil sigma measurement and a directly sensed soil sigma measurement, and at least one of a plurality of timestamps, wherein each of the plurality of timestamps is assigned to successive ones of the plurality of meter measurement data being obtained; and at least one remote computing device in communication with the mobile metering device through a network, the at least one remote computing device configured to at least: configure the mobile metering device and deliver settings for corresponding ones of the plurality of measurement subsystems for at least operation at an operating frequency and at a signal conditioning circuit setting; download and store at least a subset of the plurality of meter measurement data locally stored by the mobile metering device; and generate a user interface for display, the user interface indicating a normalized electromagnetic field strength over distance curve of the surface wave from the Zenneck surface waveguide probe to at least an intersecting point of an equivalent radiating wave curve on a substantially timestamp synchronized timeline.

The remote computing device(s) may generate the normalized field strength over distance curve by adjusting at least one of the plurality of electromagnetic field measurements based on substantially similarly timestamped ones of the plurality of meter measurement data selected from the plurality of meter environmental data and the plurality of soil sigma measurements associated with a respective one of the mobile metering device that generated the at least one of the plurality of electromagnetic field measurements.

In some embodiments, a method comprises conveying a mobile metering device having a plurality of measurement subsystems, along a lossy conducting medium relative to a guided surface waveguide probe; obtaining and locally storing a plurality of meter measurement data local to the mobile metering device while being conveyed along the lossy conducting medium, wherein the plurality of meter measurement data is indicative of a guided surface wave transmitted by a guided surface waveguide probe including a plurality of electromagnetic field measurement data, a plurality of weather sensor data, at least one of a plurality of direct soil sigma measurements, and at least one of a plurality of timestamps that correspond to successive ones of the plurality of meter measurement data being obtained; downloading, by a remote computing device, at least a subset of the plurality of meter measurement data locally stored by the mobile metering device; and generating a user interface for display, the user interface indicating a normalized electromagnetic field strength over distance curve of the surface wave from the guided surface waveguide probe to at least an intersecting point of an equivalent radiating wave curve on a substantially timestamp synchronized timeline.

The mobile metering devices may be configured based on operational parameters delivered by the remote computing device that include at least a target frequency of the guided surface wave being monitored and settings for a signal conditioning circuit.

In some embodiments, a mobile metering device may comprise a meter processing system configured to control a plurality of measurement subsystems each configured to obtain and locally store at least one of a plurality of meter measurement data local to the mobile metering device indicative of a guided surface wave at a frequency as low as 1 Kilohertz, the plurality of measurement subsystems include at least: a soil sigma subsystem configured to obtain the respective subset of the plurality of meter measurement data for a plurality of soil sigma measurements; a weather sensor subsystem configured to obtain the respective subset of the plurality of meter measurement data for a plurality of weather sensor data; and a electromagnetic field strength measurement system configured to obtain the respective subset of the plurality of meter measurement data for a plurality of electromagnetic field measurements, the electromagnetic field strength measurement system including at least: a 3-axis antenna; an electromagnetic field meter; a signal conditioning circuit coupled between the 3-axis antenna and the electromagnetic field meter, wherein a low frequency signal detected by the 3-axis antenna is passed through the signal conditioning circuit, the signal conditioning circuit including: at least one signal filter circuit each remotely configurable by way of a signal conditioning interface to operate in at least two operable states of active or inactive; at least one amplification circuit comprising an impedance match circuitry preceding at least two amplifiers in series, the at least one amplification circuit being remotely configurable by way of a signal conditioning interface to operate in any one of at least three operable states selected from a first state wherein the impedance match circuitry and the at least two amplifiers are inactive, a second state wherein the impedance match circuitry and one of the at least two amplifiers are active, or a third state wherein the impedance match circuitry and the at least two amplifiers are active; and wherein the meter processing system is further configured to transmit, upon request by a remote computing environment, locally stored ones of the at least one of the plurality of meter measurement data to the remote computing environment that is accessible to the mobile metering device through a network.

In some embodiments, the 3-axis antenna may be a mobile 3-axis passive multi-turn antenna.

In some embodiments, the signal filter circuit(s) may be selected from at least a low pass filter, a band pass filter, or a high pass filter.

In some embodiments, a metering device may comprise: an at least 3-axis passive multi-loop antenna configured to self-adjust reception of a guided surface wave independent of directional orientation of the at least 3-axis passive multi-loop antenna at a fixed location or while in motion affixed to a conveyance relative to a guided surface wave transmission source; at least one measurement sensor subsystem configured to obtain measurement data relevant to a guided surface wave from a guided surface wave transmission source; and a metering device controller having one or more processors and at least one memory storing executable instructions that, if executed by the one or more processors, cause the one or more processors to perform one or more operations on at least one system or subsystem within operational control of the metering device. Further, the at least one measurement sensor subsystem may include one or more of an electromagnetic field sensor subsystem, an atmospheric condition sensor subsystem, and a soil sigma sensor subsystem.

In some embodiments, the executable instructions, if executed by the one or more processors, may cause the one or more processors to perform one or more further operations comprising: communicating, by way of a network, with at least one primary computing environment located remotely from the metering device; alternatively coupling, in response to a coupling configuration request from the at least one primary computing environment, one of the at least one amplifier and one of the at least one bypass conductor between the 3-axis passive multi-loop antenna and the electromagnetic field sensing meter; performing and reporting on, in response to a configuration verification request received from the at least one primary computing environment, configuration status and settings for one or more system or subsystem within operational control of the metering device; implementing and reporting on, in accordance with configuration data and a configuration request received from the at least one primary computing environment, at least one configuration setting for one or more system or subsystem within operational control of the metering device; activating or deactivating, in accordance with an activate/deactivate request received from the at least one primary computing environment, the metering device or one or more system or subsystem within operational control of the metering device; generating and storing in a local memory a plurality of records in real time, each of the plurality of records including a timestamp and at least one data item obtained concurrently with the timestamp from among the proximate measurement data being obtained by each of the at least one measurement sensor subsystem; and transmitting at least one of the plurality of records from the local memory to the at least one primary computing environment. The transmitting of the at least one of the plurality of records may be triggered by one or more of: a request from the at least one primary computing environment; a regular or random interval timer; a local memory threshold alarm; and availability of the network connecting the metering device and the at least one primary computing environment.

The signal conditioning circuit may further comprise a low pass filter coupled between the at least 3-axis passive multi-loop antenna and the electromagnetic field sensing meter such that the output signal generated by the at least 3-axis passive multi-loop antenna is passed through the low pass filter. In some embodiments, the signal conditioning circuit may further comprise a band pass filter coupled between the at least 3-axis passive multi-loop antenna and an electromagnetic measurement sensor subsystem such that the output signal generated by the at least 3-axis passive multi-loop antenna is passed through the band pass filter.

FIG. 1 is a graph that shows examples of electromagnetic field strength over distance of a radiation wave and a guided surface wave. The y-axis of graph 100 depicts electromagnetic field strength in decibels (dB) above an arbitrary reference in volts per meter as a function of distance on the x-axis in kilometers on a log-dB scale. A radiated electromagnetic field strength curve 106 illustrates the electromagnetic field strength of a radiated electromagnetic field as a function of distance. A guided electromagnetic field strength curve 103 illustrates the field strength of a guided electromagnetic field over distance. This guided electromagnetic field strength curve 103 has the characteristics of a transmission line mode curve.

The shape of the radiated electromagnetic field strength curve 106 propagation and the guided electromagnetic field strength curve 103 propagation is noteworthy. The radiated electromagnetic field strength curve 106 has a characteristic linear decay of 1/d, where d is distance on the log-log scale. The guided electromagnetic field strength curve 103 has a characteristic exponential decay of $e^{-\alpha d}/\sqrt{d}$ and exhibits a knee 109 where electromagnetic field strength begins to rapidly drop over distance to a crossover point 108 with the radiated electromagnetic field strength curve 106.

Figure 2:
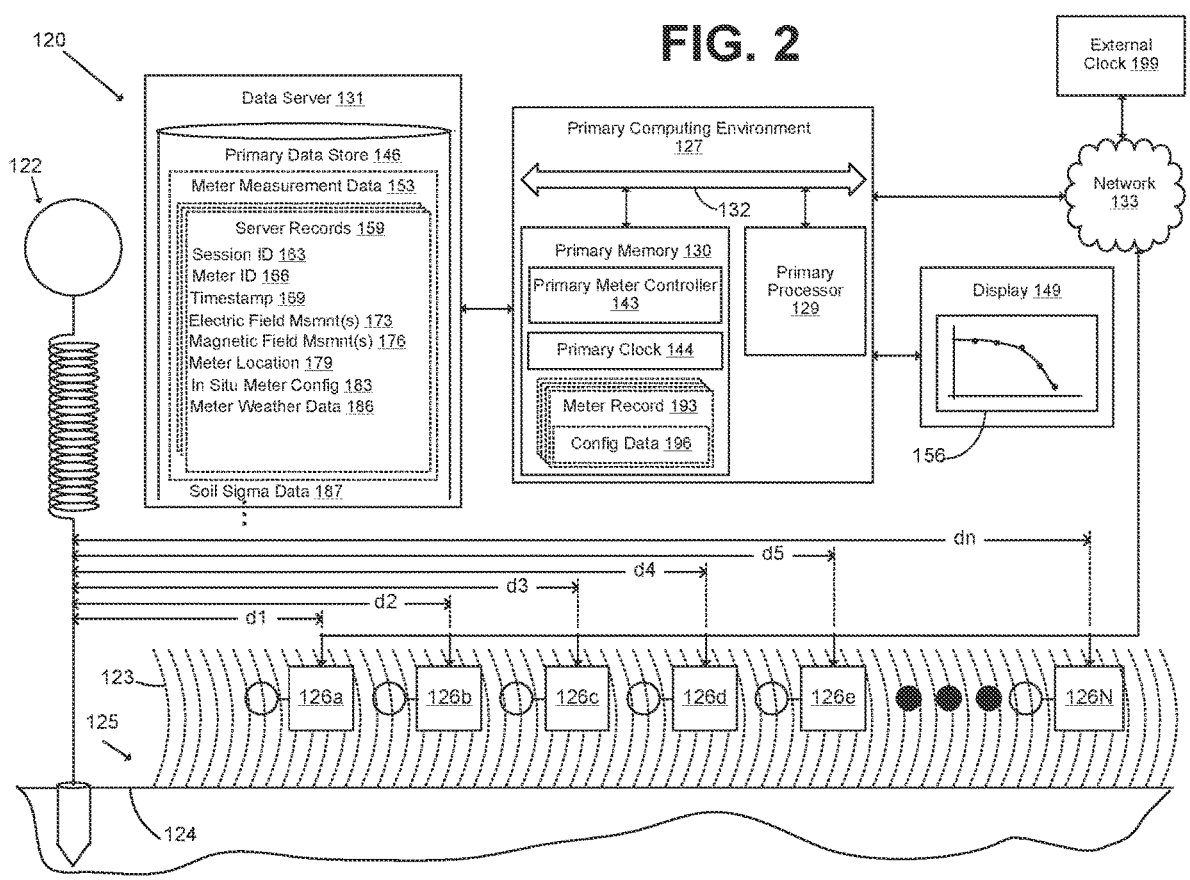
FIG. 2 illustrates an elevation view of a transmission measurement system according to various embodiments of the present disclosure.

FIG. 2 illustrates an elevation view of a transmission measurement system 120 according to various embodiments of the present disclosure. The transmission measurement system 120 can include, but is not limited to, a plurality of independently functioning systems, subsystems, methods, and apparatus that collectively communicate with each other by at least one network 133. Communication across the transmission measurement system 120 is useful to control and coordinate systems, methods, and apparatus, including but not limited to, data collection, data analysis, data display and replay, measurable aspects relating directly or indirectly to, or are indicative of, or that externally impact, a guided surface wave 123. One example of the guided surface wave 123 is a Zenneck surface wave or other variety of guided surface wave, transmitted by a guided surface waveguide probe 122 such as a Zenneck surface waveguide probe or other variety of guided surface waveguide probe.

The guided surface wave 123 transmitted by the guided surface waveguide probe 122 travels along the surface of a lossy conducting medium 124. The lossy conducting medium 124 may comprise, as one example, a terrestrial medium such as the Earth's surface. On Earth, a terrestrial medium may comprise some or all structures and formations thereon whether natural, man-made, or refined by man. Examples of natural elements include, but are not limited to, rock, soil, sand, fresh water, sea water, minerals, trees, vegetation, and all other natural elements that make up the planet Earth. Examples of man-made elements include, but are not limited to, concrete, asphalt, metals, composites, building materials of any type, and other man-made materials whether conductive or non-conductive. In other embodiments, the lossy conducting medium 124 may comprise some medium other than the Earth, whether naturally occurring or man-made. For the Earth's surface as the lossy conducting medium 124, an atmospheric medium 125 is adjacent to the lossy conducting medium 124 and comprises a mix of gases and other elements, collectively referred to herein as "air," that make up an atmospheric layer above the Earth's surface.

The guided surface waveguide probe 122 is a simplified representation of any type of guided surface waveguide probe including but not limited to a Zenneck surface waveguide probe that may be employed. Nonlimiting examples of guided surface waveguide probes and further details are described in the following Patent Cooperation Treaty Applications Publications: Patent Cooperation Treaty Application Publication WO2014/137817 published on Sep. 12, 2014, Patent Cooperation Treaty Application Publication WO2016/039832 published on Mar. 17, 2016, Patent Cooperation Treaty Application Publication WO2016/195738 published on Dec. 8, 2016, and Patent Cooperation Treaty Application Publication WO2018/164965 published on Sep. 13, 2018. Other apparatus and configurations that produce a guided surface wave 123 are described in U.S. patent application Ser. No. 16/708,048 filed on Dec. 9, 2019 (now U.S. Pat. No. 11,340,275 issued May 24, 2022) entitled "Anisotropic Constitutive Parameters for Launching a Zenneck Surface Wave," and U.S. patent application Ser. No. 17/683,847 filed on Mar. 1, 2022 entitled "Anisotropic Constitutive Parameters for Launching a Zenneck Surface Wave."

The transmission measurement system 120 includes a plurality of metering devices 126$a$-N that may be positioned on and/or above the lossy conducting medium 124 within the atmospheric medium 125. According to various embodiments, each of the plurality of metering devices 126$a$-N may be positioned individually at a point along the lossy conducting medium 124 as illustrated in the elevation view of FIG. 2. The intervals can be a regular distance $d_{1-n}$ from the guided surface waveguide probe 122, or irregular distances, or at a mix of regular and irregular distances, in which case the interval between two respective distances $d_{1-n}$ may be denoted as the interval $d_x$–$d_{x-1}$ varies.

Figure 3:
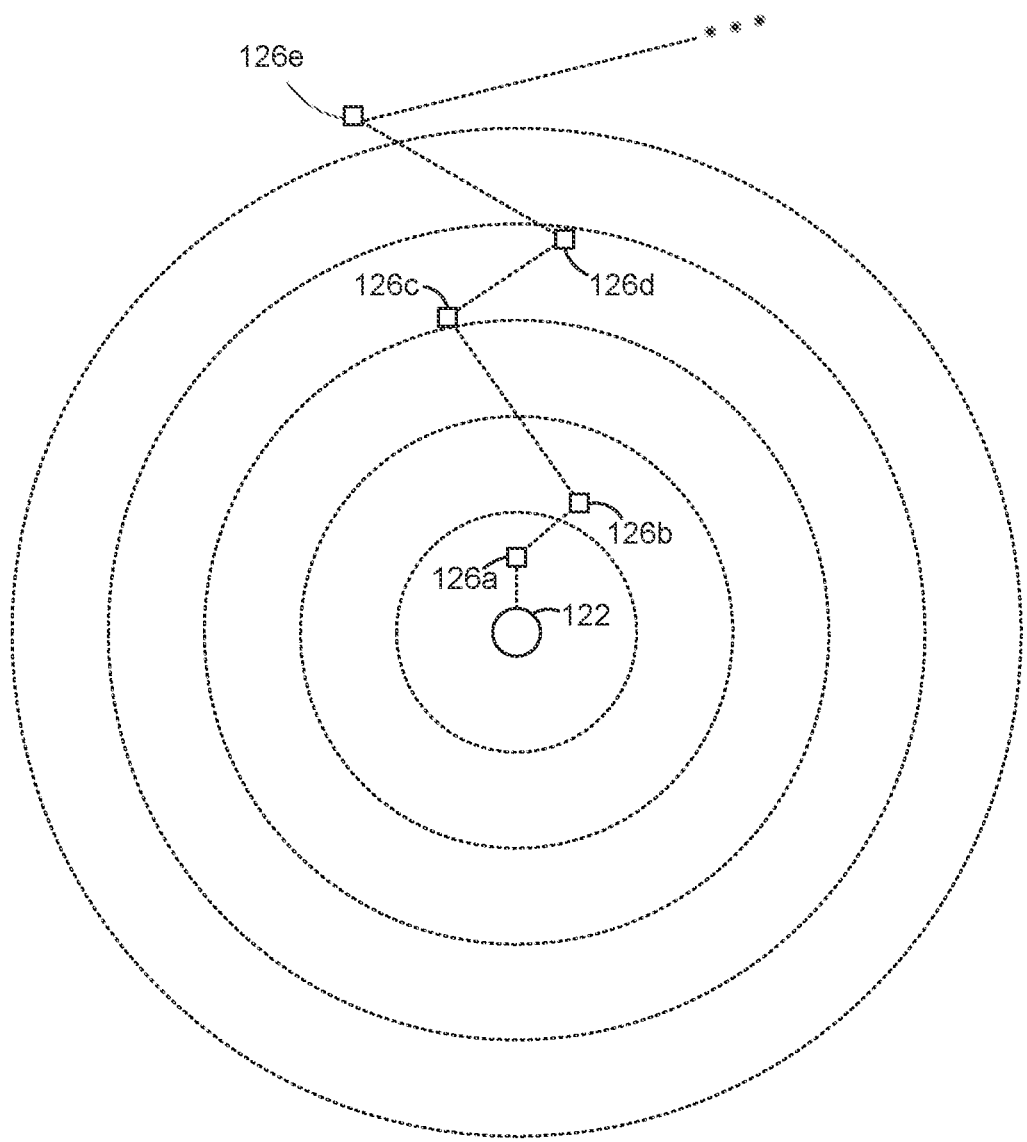
FIG. 3 depicts example placements of metering devices of the transmission measurement system according to various embodiments of the present disclosure.

FIG. 3 depicts example placements of metering devices of the transmission measurement system according to various embodiments of the present disclosure. Metering devices 126$a$, 126$b$, 126$c$, 126$d$, and 126$e$ are depicted as being positioned at intervals that are as regular as is practical and as linearly aligned with one another relative to a linear radial originating at the guided surface waveguide probe 122 as circumstances permit. Circumstances impacting the interval between any two metering devices 126$a$-126$e$ and/or their linear alignment relative to the guided surface waveguide probe 122 may be the result of any one or combination of factors including but not limited to terrain, manmade structures, obstacles, access to power, access to network 133, property owner permissions, and the like. To the extent conductivity ($\sigma$) and permittivity ($\varepsilon$) of the atmospheric medium 125 (i.e., air) and the lossy conductive medium 124 (e.g., Earth's surface) vary among the various locations of the metering devices 126$a$-126$e$, raw electromagnetic field strength measurements produced by each of the metering devices 126$a$-126$e$ at each location may benefit from normalization or other adjustments based on local measurements of local weather and the conductivity ($\sigma$) and permittivity ($\varepsilon$) of the ground at each metering device location 126$a$-126$e$. As will be discussed, adjustments and normalization of data across the entire end-to-end distance of the guided surface wave 123 being monitored may promote meaningful data analysis, graph plotting, and an overall uniform understanding of the behavior and characteristics of the guided surface wave 123 and the performance of the guided surface wave guide probe 122.

Returning to FIG. 2, the transmission measurement system 120 may further include a primary computing environment 127 coupled to a network 133. The primary computing environment 127 may include, but is not limited to, at least one processor circuit, for example, such as a primary processor 129 and a primary memory 130, both of which are coupled to a primary interface 132. The primary computing environment 127 may comprise, for example, at least one server or apparatus having a similar purpose. Primary interface 132 may comprise, as one example, a data bus with an accompanying address/control bus or other bus structure as can be appreciated.

Stored in the primary memory 130 may be both data and several components that are executable by the primary processor 129. In the illustrated example, stored in the primary memory 130 and executable by the primary processor 129 are a primary meter controller 143, a primary clock 144, and potentially other applications. Alternatively, the primary clock 144 may reside within the circuitry of the primary processor 129 as can be appreciated. In addition, an operating system may be stored in the primary memory 130 and executable by the primary processor 129.

It is understood that there may be other applications that are stored in the primary memory 130 and are executable by the primary processor 129 as can be appreciated. Where any component discussed herein is implemented in the form of code, any one of a number of programming languages may be employed such as, for example, C, C++, C#, Objective C, Java, Javascript, Perl, PHP, Visual Basic, Python, Ruby, Delphi, Flash, or other programming languages.

The primary meter controller 143 may be stored in the primary memory 130 and is executable by the primary processor 129. In this respect, the term "executable" means a program file that is in a form that can ultimately be run by the primary processor 129. Examples of executable programs may be, for example, a compiled program that can be translated into machine code in a format that can be loaded into a random access portion of the primary environment memory 130 and run by the primary processor 129, source code that may be expressed in proper format such as object code that is capable of being loaded into a random access portion of the primary memory 130 and executed by the primary processor 129, or source code that may be interpreted by another executable program to generate instructions in a random access portion of the primary memory 130 to be executed by the primary processor 129, etc. An executable program may be stored in any portion or component of the primary memory 130 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The primary memory 130 is defined herein as including both volatile and nonvolatile memory and data storage components. Volatile components are those that do not retain data values upon loss of power. Nonvolatile components are those that retain data upon a loss of power. Thus, the primary memory 130 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

The primary processor 129 may represent multiple processors and the primary memory 130 may represent multiple memories that operate in parallel processing circuits, respectively. In such a case, the primary interface 132 may be an appropriate network that facilitates communication between one or more of the primary processor 129, and one or more of the primary memory 130. The primary interface 132 may comprise additional systems designed to coordinate this communication, including, for example, performing load balancing. The primary processor 129 may be of electrical or of some other available construction.

The primary computing environment 127 may also comprise various devices such as, for example, one or more programmable logic controllers or other types of computing devices.

The primary computing environment 127 is coupled to and in communication with the network 133. The network 133 may comprise, for example, General Purpose Interface Bus (GPIB) connections corresponding to IEEE 488.2, the Internet, intranets, extranets, wide area networks (WANs), local area networks (LANs), wired networks, wireless networks, or other suitable networks, etc., or any combination of two or more such networks. For example, such networks can include satellite networks, cable networks, Ethernet networks, and other types of networks as a matter of design choice or availability.

The primary computing environment 127 may also be in communication with a data server 131. The data server 131 may be coupled directly to the primary computing environment 127 or the primary computing environment 127 may communicate with data server 131 through a public or private network such as network 133. One or more of the metering devices 126a-N may also be coupled to and have fully enabled access to network 133 such that a coupled metering device may be individually in data communication with the primary computing environment 127.

A server data store 146 may exist in or be communicatively coupled to data server 131. Server data store 146 may comprise, for example, a database or other data storage structure. A display device 149 may be coupled to the primary computing environment 127, and at minimum standard input/output devices are coupled to the primary computing environment 127. The primary meter controller 143 may perform various functions including configuring the metering devices 126a-N for operation, obtaining meter measurement data 153 and potentially other information from the metering devices 126a-N, and storing such meter measurement data 153 in the server data store 146. In addition, the primary meter controller 143 may render various user interfaces 156 on the display device 149.

Various data is stored on the server data store 146 that may be written, accessed, or changed by the primary meter controller 143 executed on the primary computing environment 127. Types of data stored on server data store 146 is without limit. As one nonlimiting example in the context of a transmission measurement system 120, types of data can include but are not limited to, meter measurement data 153 which are data collected from the plurality of metering devices 126a-N. The meter measurement data 153 within server data store 146 may include, for example, a plurality of server records 159, each server record being a copy of data collected by a given one of the plurality of metering devices 126a-N. Data within a server record 159 may include, but is not limited to, data fields such as, a session identifier 163, a meter identifier 166, a timestamp 169, electric field measurements 173, magnetic field measurements 176, metering device location 179 (e.g., coordinates), in-situ meter configuration 183, meter weather data 186, soil sigma data 187, and other data fields relating to the monitored operational status and measurements of the probe and/or near-field measurements inside the crossover point and inside the safety perimeter.

A server record 159 may be associated with a metering device 126 by a meter identifier 166. Each of the metering devices 126a-N may be uniquely identified by a meter identifier 166.

Measurements taken over an amount of time by a given metering device 126 may be identified in server record 159 by a session identifier 163. There may be multiple amounts of time in which measurements are collected and each amount of time may be identified by a session identifier 163. Alternatively, there may be multiple server records 159 having the same session identifier 163 that may represent continuous measurements taken by a given metering device 126 over a span of hours, days, or weeks. In another embodiment a session recording identifier 163 may represent measurements collected by all or a given one of the metering devices 126a-N during a span of time in which the configuration of a given metering device 126 or the guided surface waveguide probe 122 has been reconfigured or altered in some way to determine the effect of the change to the guided surface wave 123 or the ability to measure aspects of the guided surface wave 123.

Timestamp 169 represents the time when the data within a given server record 159 was collected by a given one of the metering devices 126. Each metering device 126a-N includes a local clock 361 to generate the timestamp 169 when such metering device 126a-N captures measurements and populates a local record 159.

Electric field measurement 173 may comprise a raw measurement of the electric field at the location of a measuring one of the plurality of metering devices 126a-N. The electric field measurement 173 may comprise one reading or multiple readings of the electric field of guided surface wave 123 taken across a single axis or across multiple different axes (e.g., 3 axes, 6 axes).

Magnetic field measurement 176 comprises a raw measurement of the magnetic field at the location of a measuring one of the plurality of metering devices 126a-N. The magnetic field measurement 176 may comprise multiple measurements taken along a single axis or across multiple axes (e.g., 3 axes, 6 axes).

Electromagnetic field measurements 173/176 taken by a fixed-position metering device 126 may benefit from the deployment of a mobile metering device to supplement measurements taken by fixed position metering devices 126a-N. A 6-axis metering device can further supplement the measurement data with the determination of the Poynting vector for the guided surface wave 123. Further, electromagnetic field measurements 173/176 may comprise a trace of multiple measurements taken across a frequency range. A given trace may be specified in terms of a center frequency and a span, a center frequency with a low and high frequency, or such a trace can be defined in some other manner. A predefined number of electromagnetic field measurements 173/176 may be taken within a given trace, where each measurement is taken at predefined intervals across the frequency spectra of the trace. In one embodiment, up to 1000 or more different electromagnetic field measurements 173/176 may be taken in a single trace that are evenly spaced across the frequency spectrum of the trace. The number of electromagnetic field measurements 173/176 that are taken can be any number of measurements reasonably obtained during normal operation over a given time. The electromagnetic field measurement 173/176 at the center frequency of a trace may be the ultimate frequency of interest, where the remaining measurements of the trace may indicate a degree of noise in the frequency spectra of the trace or may indicate other information.

Meter location 179 identifies a geographical location of a given one of the plurality of metering devices 126a-N. The meter location 179 may be expressed in terms of geographical coordinates, GPS coordinates, or other coordinate system.

In-situ meter configuration 183 includes one or more parameters with which each of the metering devices 126a-N and their measuring subsystems were configured for operation. Such a configuration may include the target frequency where electric and magnetic field strengths are to be measured, metering device antenna orientation, the intervals between measurements being taken, among others. The in-situ meter configuration 183 may also specify information about the traces of electromagnetic field measurements 173/176 such as a center frequency and span, a center frequency and low and high frequencies of the span, or other information specifying where measurements are taken. Such parameters may also include configuration data that determines how a Fourier transform is performed, if any, and the units of measure such as millivolts per meter or volts per meter, etc. Given in-situ meter configuration 183 stored in the server records 159, the state of the respective metering device 126a-N may be known at the time that the electromagnetic field measurements were taken.

Local weather data 186 may include meteorological and environmental data proximate to a measuring one of the plurality of metering devices 126a-N. At least one or more meteorological and/or environmental sensors can be deployed to collect data including, but not limited to, a thermometer for temperature measurements, a barometer for air pressure measurements, a hygrometer for water vapor measurements, a sling psychrometer for humidity measurements, rain and/or snow gauges for precipitation measurements, an anemometer for wind speed measurements, and/or a wind vane for wind direction measurements. Meteorological and environmental measuring instruments may be configured to generate a measurement of at least one factor associated with the weather and environment proximate to respective ones of the plurality of metering devices 126a-N. Other sensors may be included such as an accelerometer to detect undesirable movement of any one of the plurality of metering devices 126a-N. A global positioning system (GPS) sensor and/or a compass can be included to sense position and orientation of a respective one of the plurality of metering devices 126a-N. Sensing and collecting local meteorological, weather, and environmental data proximate to each of the plurality of metering devices 126a-N facilitates an understanding of what is happening in the atmospheric medium 125 (i.e., air) immediately above the lossy conducting medium 124 (i.e., Earth surface, soil). Moisture content and temperature of the air is continuously changing and is an important external factor impacting the conductivity and permittivity of the air. Measuring and recording the components contributing to moisture content and temperature (i.e., weather factors generally) facilitates the ability to accurately adjust raw measurements of electric field 173 and magnetic field 176 strength which can otherwise result in an inaccurate interpretation of a strong, weak, or otherwise skewed field strength reading of the guided surface wave 123 at the location of a given one of the plurality of metering devices 126a-N.

Soil sigma data 187 collected from sensors in the soil facilitate an understanding of the conductivity and permittivity of the soil proximate to each of the plurality metering devices 126a-N. Reasons for collecting data to track the ever-changing conductivity and permittivity in soil are similar to the reasons for air. Sensing and collecting local soil sigma data proximate to each of the plurality of metering devices 126a-N facilitates an understanding of what is happening in the lossy conducting medium 124 (i.e., Earth surface, soil). Analyzing a core sample of geological stratification and content of the top 10 meters of surface soil local to each of the plurality of metering devices 126a-N (sampling less depth or more depth as location and situation dictates) is informative as to the expected conductivity and permittivity of the soil, but soil sigma sensors may be used to measure the ongoing ever-changing moisture content of the soil at each location. Moisture content and temperature of the soil are continuously changing and are important external factors impacting the conductivity and permittivity of the soil. Soil sigma measurements to monitor the moisture content and temperature of the soil along with corresponding measurements for the air, facilitate accurate adjustments to raw measurements of electric field 173 and magnetic field 176 strength. Without these air and soil measurements at the location of each metering device 126a-N and the adjustment factors they provide, inaccurate interpretation of a raw electromagnetic field strength reading relative to the guided surface wave 123 can result.

Other sensors may also be included to determine the status of the various component devices and measurement subsystems within and under the control of each of the plurality of metering devices 126a-N. These additional sensors can include, but are not limited to, tamper switches, battery condition sensors, power input sensors, and other operational parameter sensors may be used. A tamper switch can indicate that a third party has tampered with a metering device 126 or its local equipment by opening a cover. Wind, rain, moving water, landslides and the like can also be detected by appropriate sensors and reporting. Battery condition sensors provide the current status of any batteries that are used to power or provide back-up power to any one or more of the plurality of metering devices 126a-N. Power input sensors may indicate whether the input power to the metering devices 126a-N is experiencing problems such as low voltage or other conditions, where the power may be obtained from external utility sources, solar panels, or other sources.

Returning to the discussion of primary computing environment 127 in FIG. 2, a primary meter controller 143 may be executable in the primary computing environment 127 to configure the operation of the metering devices 126a-N, obtain records 159 from the metering devices 126a-N, generate and render user interfaces 156 on the display device 149 that depict the electric and magnetic field measurements 173/176 of the records 159 obtained, and/or other functions.

Primary memory 130 or other memory accessible to the primary computing environment 127 may store data about the metering devices 126a-N within a meter record 193. Each meter record 193 may include, but is not limited to, configuration data 196 that are the operational settings that can be used to configure or reconfigure each of the metering devices 126a-N. The in-situ meter configuration 183 data represent the last known set of configuration settings for a given metering device 126.

The user interface 156 rendered on the primary display device 149 may be generated by the primary meter controller 143. User interface 156 may be configured to display any one of the available meter measurement data 153 types or combinations of such data based on a predefined rotation of displays or as a user selection on demand, for example.

External clock 199 represents one or more external clocks of particular accuracy to which the primary clock 144 and local clock 361 in each of the plurality of metering devices 126a-N can be synchronized. Synchronizing to external clock 199 ensures system wide accuracy of timestamps 169 and the operational coordination cross the transmission measurement system 120. External clock 199 represents an Internet clock, an atomic clock, or other high-accuracy clock as can be appreciated.

Given the introduction of the various components of the transmission measurement system 120 set forth above, a further operational disclosure is provided. To begin, assume that it is desired to determine the signal output of a guided surface waveguide probe 122. To accomplish this end, individual ones of a plurality of metering devices 126a-N may be positioned along the lossy conducting medium 124 relative to the guided surface waveguide probe 122. The metering devices 126a-N are each positioned at desired distances $d_{1-N}$ away from the guided surface waveguide probe 122. The position and precise distance of any one of the plurality of metering devices 126a-N may depend in part on desirable or undesirable geographical features, man-made structures, availability of power, public and private land access rights, or other physical or practical limitations. Positioning and/or conveying each of the metering devices 126a-N is commonly performed and controlled manually but can be implemented in whole or in part by a self-deploying configuration or remote drone deployed metering device 126, for example, as logistical situations and available deployment technologies dictate. By whatever means a metering device 126 is deployed in the field for the first time or as a replacement, a battery of certification, sanity, and readiness checks may be performed manually and/or remotely to verify the metering device's configuration and confirm the device's readiness for operation as well as all sensor subsystems accompanying and under the control of respective ones of the plurality of metering devices 126a-N.

The following discussion relates to metering devices 126a-N that have been individually or collectively as a group or subgroup deployed and certified as ready for operation. Each of the plurality of metering devices 126a-N and any one or all sensing subsystems associated with each of the plurality of metering devices 126a-N can be configured for operational use prior to sensing and collecting data. A user may proceed to cause the primary meter controller 143 to activate and configure an individual one or a group of the plurality of metering devices 126a-N and their respective sensor subsystems for operation. In one nonlimiting embodiment, activating one or more metering devices 126a-N can be manually done by a user at a metering device 126 location and proceed to also activate any one or more of its local sensor subsystems as desired. In another nonlimiting embodiment a user can cause the primary meter controller 143 to send an activate instruction to any one or more of the plurality of metering devices that are to be activated. In another nonlimiting embodiment the primary meter controller 143 can be configured to cause any one or more of the metering devices 126a-N to activate based on elapsed time, operational or situational status, or any other reason or occurrence resulting in the determination that one or more of the plurality of metering devices 126a-N are to be activated. Activating a specific one or more of the plurality of metering devices 126a-N may be accomplished by accompanying an activate instruction with a meter identifier 166 of the metering device 126 that is to be activated. The plurality of metering device 126a-N may be deactivated in a similar manner.

Configuring activated ones of the plurality of metering devices 126a-N establishes operational parameters for nominal operation of each device and their accompanying sensor subsystems. A user may enter or otherwise specify the configuration data 196 and a meter identifier 166 for any one or more of metering devices 126a-N being configured. Configuration data 196 can be input using various input devices such as a keyboard, mouse, voice, or other input means. Various user interfaces may be created that present mechanisms such as drop-down menus, picklists, input fields, and other mechanisms to facilitate entry of the configuration data 196.

Configuration data 196 is stored in the primary memory 130 or other memory as mentioned above. Thereafter, the primary meter controller 143 communicates the configuration data 196 to each of the metering devices 126a-N that are to be used in obtaining electromagnetic field measurements 173/176.

The primary meter controller 143 may ensure that the clocks that generate the timestamps 169 in each of the metering devices 126a-N are accurate. In one approach, this may be accomplished by ensuring the accuracy of the primary clock 144 relative to external clock 199. The primary meter controller 143 may communicate with each of the metering devices 126a-N to obtain a timestamp 169 from each for comparison. Corrective action is taken for any local clock producing a timestamp 169 outside a predetermined tolerance. Other approaches may be employed to synchronize clocks across the transmission measurement system 120.

A metering device 126 can proceed to configure and initialize (e.g., power up, attain operational status, and/or the like) based on the configuration data 196 received from the primary meter controller 143. Whether implementing new operational settings from configuration data 196 or confirming existing operational settings, respective ones of the metering devices 126a-N may communicate operational readiness to the primary meter controller 143 and measurement activities begin for the respective metering devices 126a-N.

During the acquisition and storing of meter measurement data 153 in respective ones of the plurality of server records 159, the primary meter controller 143 may generate the user interface 156 to display the incoming meter measurement data 153 on the display device 149. One example of the user interface 156 generated by primary meter controller 143 can include but is not limited to, a raw electromagnetic field strength over distance curve 226 from select ones of the electromagnetic field measurements 173/178 obtained from a plurality of the metering devices 126a-N monitoring the guided surface wave 123 generated by the guided surface waveguide probe 122. Such electromagnetic field strength may be the magnetic field strength 176 or the electric field strength 173. The primary meter controller 143 may also generate an adjusted or normalized electromagnetic field strength curve 226 by factoring all relevant meter measurement data 153 that can influence electromagnetic field strength, including but not limited to local weather data 186 and soil sigma data 187. Corrective curve fitting techniques may also be employed where data is missing for any reason along the curve. Primary meter controller 143 may generate other reference curves that may be presented in the user interface 156 for purposes of comparison with the curve representative of the transmission of the guided surface waveguide probe 122 as will be described.

Figure 4:
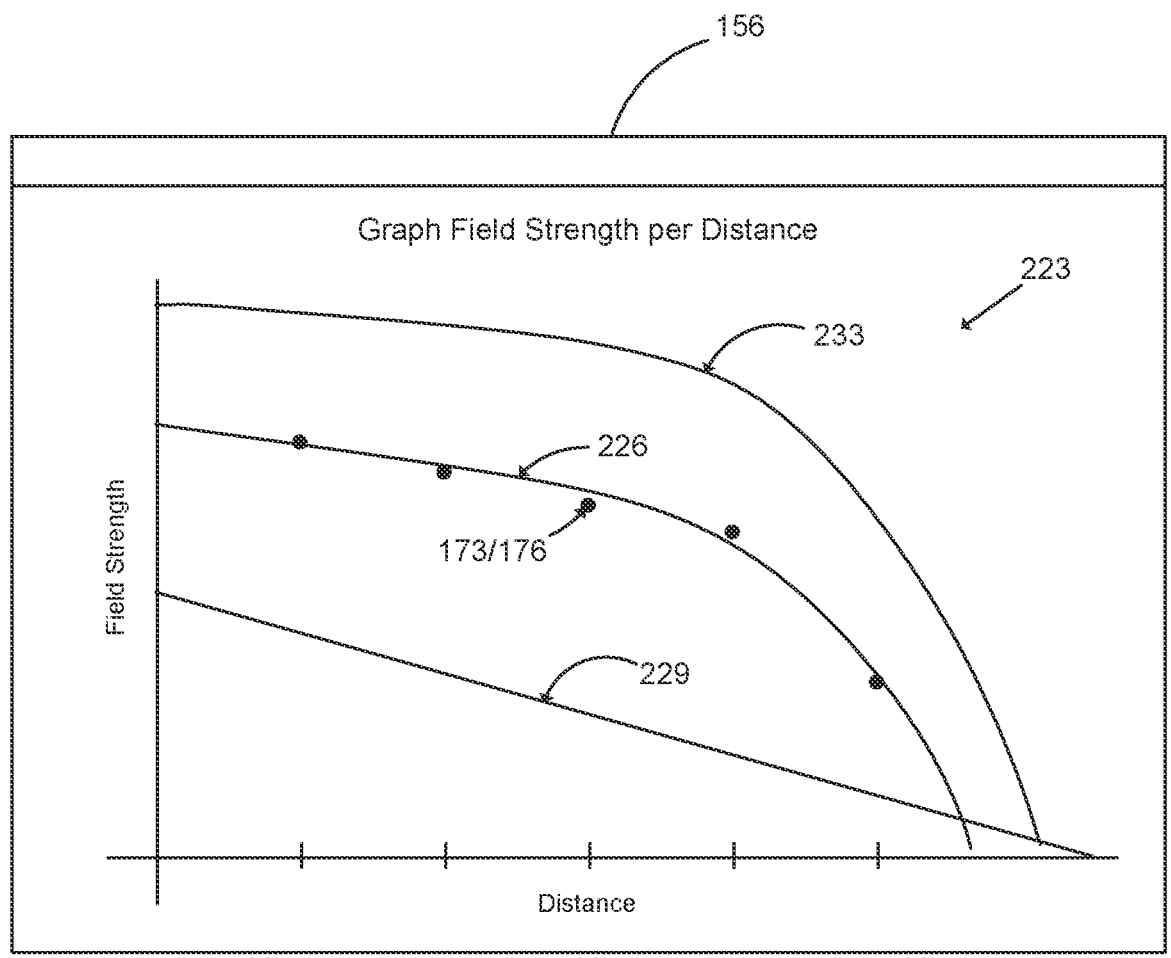
FIG. 4 is an example of a graphical user interface generated by the transmission measurement system according to various embodiments of the present disclosure.

FIG. 4 is an example of a graphical user interface generated by the transmission measurement system according to various embodiments of the present disclosure. User interface 156 depicts a theoretical 100% efficient electromagnetic field strength over distance curve 223 for a given frequency. This provides a reference curve for a perfect operational scenario at a given frequency for a guided surface wave 123 transmitted by a guided surface waveguide probe 122 at a given distance.

Primary meter controller 143 may use curve fitting techniques to calculate a near real time adjusted or normalized electromagnetic field strength over distance curve 226 based on collected data at each metering device location, including but not limited to electromagnetic field strength measurements 173/176, local weather data 186, and soil sigma data 187. While the term "near real time" is used herein, it is understood that there will be a delay of a very short period of time after the electromagnetic field measurements 173/176 are generated to communicate the local records 159 from the metering devices 126a-N and to access meter measurement data 153 from the server data store 146 and generate the real time curve 226. Given that this delay is relatively small, the curve is considered to be generated in near real time.

A radiating wave over distance curve 229 may also be plotted on user interface 156 as a worse case reference in the event the guided surface waveguide probe 122 were transmitting only radiating waves over distance rather than a guided surface wave over distance with a knee resembling the perfect scenario surface wave curve 233.

Figure 5A:
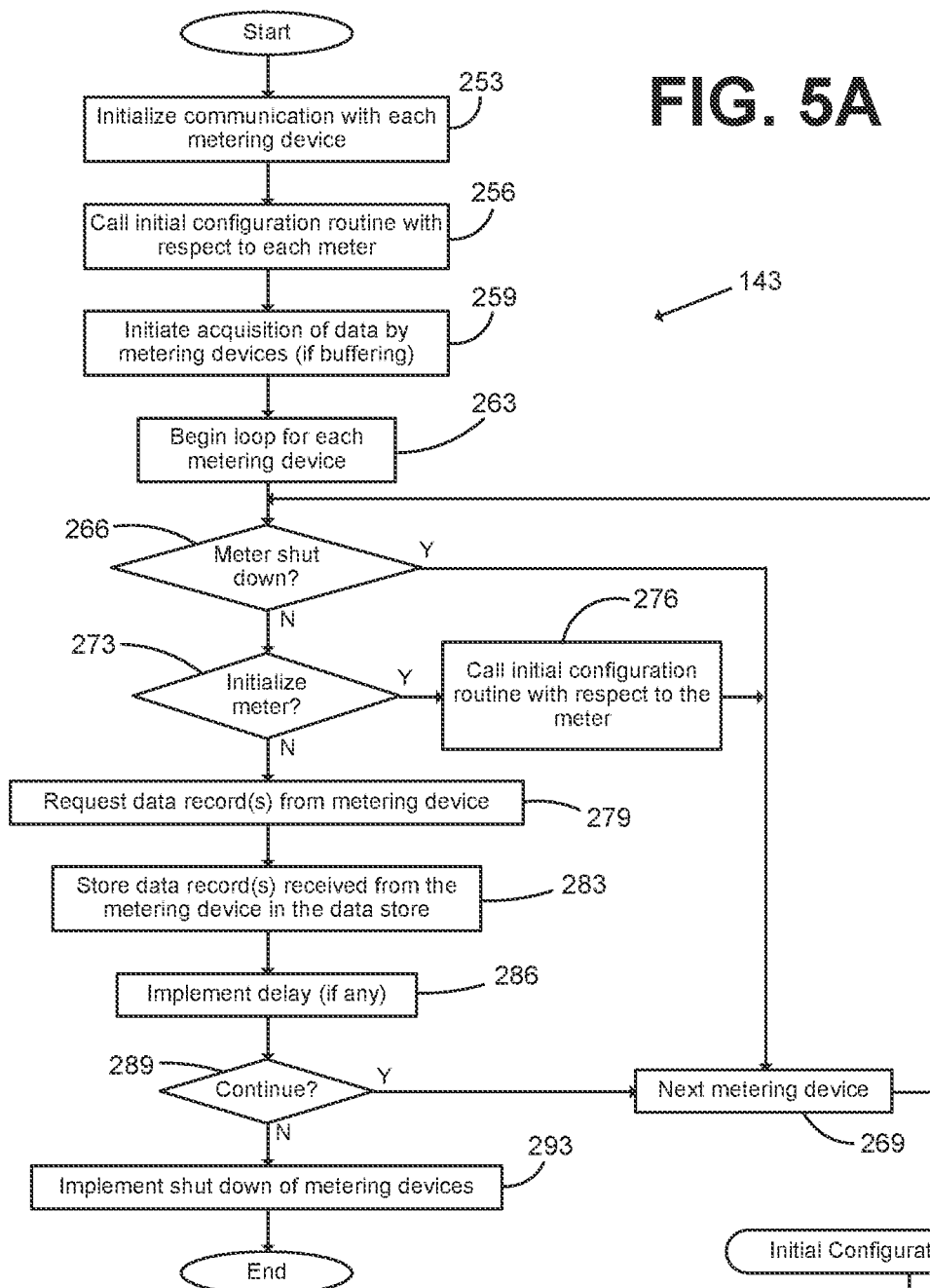
FIGS. 5A and 5B illustrate flow diagram examples of functionality implemented by the transmission measurement system according to various embodiments of the present disclosure.
Figure 5B:
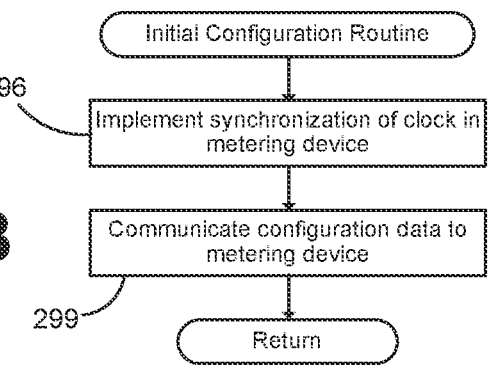

FIGS. 5A and 5B illustrate flow diagram examples of functionality implemented by the transmission measurement system according to various embodiments of the present disclosure. FIG. 5A illustrates a flow diagram of one example of the operation of a portion of the primary meter controller 143 according to various embodiments. It is understood that the flowchart of FIG. 5A provides merely an example of the many different types of functional arrangements that may be employed to implement the operation of the portion of the primary meter controller 143 as described herein. Alternatively, FIG. 5A may be viewed as depicting an example of steps of a method implemented in the primary computing environment 127 according to one or more embodiments.

At box 253, the primary meter controller 143 initializes communication with each metering device 126a-N. This step is performed, for example, to make sure that the respective metering devices 126a-N are in an active state and ready to operate. For example, various metering devices 126a-N may be inactive, broken, shut down completely due to lack of power, or are presently not needed.

Once the primary meter controller 143 has heard from all or at least an acceptable number of the respective metering devices 126a-N to facilitate operation, the primary meter controller 143 proceeds to box 256 where an initial configuration routine is called with respect to each of the metering devices 126a-N. This initial configuration routine places each metering device 126a-N in a state that facilitates the taking of electromagnetic field measurements 173/176, local weather data 186, and soil sigma data 187, among other measurements as desired in accordance with the various aspects of the present disclosure. Once the initial configuration routine is executed with respect to each metering device 126a-N and their sampling subsystems are properly configured to take measurements and send the local records 159 to the primary meter controller 143, the primary meter controller 143 proceeds to box 259.

At box 259, the primary meter controller 143 initiates the downloading of local records 159 of meter measurement data 153 acquired and locally stored by respective ones of the metering devices 126a-N. Thereafter, the primary meter controller 143 proceeds to box 263.

At box 263, the primary meter controller 143 begins a loop for each of the metering devices 126a-N. The primary meter controller 143 proceeds to box 266 to determine whether a respective one of the metering devices 126a-N is currently shut down. This is done because the metering devices 126a-N may be configured to shut down intermittently or periodically and restart to conserve power, or avoid long term overheating, or devices not needed, or other potential problems due to long-term operation. If the respective metering device 126a-N under consideration is currently shut down, then the primary metering controller 143 proceeds to box 269 where the next metering device 126a-N is identified for consideration in the loop. Thereafter, the primary meter controller 143 reverts back to box 266 as shown.

Referring back to box 266, if the primary meter controller 143 determines that the current metering device 126a-N is not shut down, then the primary meter controller 143 proceeds to box 273.

At box 273, the primary meter controller 143 determines whether the current metering device 126a-N under consideration has been initialized for operation. If not, then the primary meter controller 143 proceeds to box 276. Otherwise, the primary meter controller 143 proceeds to box 279.

At box 276, the primary meter controller 143 calls an initial configuration routine with respect to the current metering device 126a-N under consideration to configure such metering device 126a-N for operation. Thereafter, the primary meter controller 143 proceeds to box 269. However, assuming that the current metering device 126a-N has been previously initialized, then the primary meter controller 143 proceeds to box 279.

At box 279, the primary meter controller 143 requests one or more data records 159 from the currently designated metering device 126a-N. In the case that the metering device 126a-N is configured to store records 159 in a local data buffer, then the primary meter controller 143 may request and receive all of the currently stored records 159 in the data buffer of the respective metering device 126a-N. In the case that the respective metering device 126a-N does not actually store the records 159 in a local data buffer, in box 279 the primary meter controller 143 sends a request to the respective metering device 126a-N to obtain an electromagnetic field measurement 173/176 and send the same back to the primary meter controller 143 in the form of a record 159 that includes all other data as described above. Thereafter, the primary meter controller 143 proceeds to box 283.

At box 283, the primary meter controller 143 stores one or more data records 159 received from the respective one of the metering devices 126a-N in the server data store 146. The electromagnetic field measurements 173/176 included within such records 159 are then available to be accessed from in the server data store 146 by the primary meter controller 143 to generate the user interface 156 as mentioned above. To ensure that the maximum efficiency curve 233 is as up to date as possible, it may be desirable to download the records 159 from the respective metering devices 126a-N as frequently as possible with relatively low data communication latency. As such, it may be desirable to avoid significant storage of local records 159 in local data buffers of metering devices 126a-N in cases where the metering devices 126a-N include local buffering capability for the temporary storage of local data records 159.

At box 286, a delay may be implemented in situations where it is desirable. Such circumstances may exist, for example, when a number of metering devices 126a-N are currently being initialized or other circumstances may warrant a delay in the loop. In another example, it may be the case that it is desirable that a certain number of local records 159 are stored in a local data buffer in the respective metering devices 126a-N before such records 159 are downloaded to the server data store 146 by the primary metering controller 143.

At box 289, the primary meter controller 143 determines whether the current data acquisition loop is to continue or whether the data acquisition by the metering devices 126a-N is to end. The determination as to whether the loop is to continue may depend upon an appropriate operator input that indicates that the data acquisition by the metering devices 126a-N is to cease. Such might be the case, for example, when a test of a respective guided surface waveguide probe 122 has completed or the data acquisition may be stopped for some other reason.

If the primary meter controller 143 determines that the data acquisition loop is to cease in box 289, then the primary meter controller 143 proceeds to box 293. Otherwise, the primary meter controller 143 continues at box 269 where the next metering device 126a-N is designated. Thereafter, the primary meter controller 143 reverts back to box 266 as was noted above.

At box 293, the primary meter controller 143 implements a shutdown of the metering devices 126a-N. This may be done by issuing a command to the metering device is 126a-N that they are to alter their states to a stand-by or powered down state. Such a stand-by or powered down state may involve powering down all unessential components with the exception of those subsystems or components that will allow the metering devices 126a-N to communicate in the future to perform additional data acquisition in terms of obtaining electromagnetic field measurements 173/176 and other information to generate the records 159 for tests of future versions of guided surface waveguide probes 122.

Thereafter, the operation of this portion of the primary meter controller 143 ends as shown.

FIG. 5B is a flow diagram showing one example of the operation of another portion of the primary meter controller 143 comprising the initial configuration routine that is implemented to initialize the operation of the metering devices 126a-N according to various embodiments. It is understood that flow diagram FIG. 5B is an example of the many different types of functional arrangements that may be employed to implement the operation of the portion of the primary meter controller 143 as described herein. As an alternative, the flow diagram FIG. 5B may be viewed as depicting an example of steps of a method implemented in the primary computing environment 127 according to one or more embodiments.

At box 296, the primary meter controller 143 implements a synchronization of the clocks in all of the metering devices 126a-N. Various approaches may be used to accomplish this task. For example, in the case that the primary meter controller 143 seeks to synchronize the clocks of the metering devices 126a-N with the primary clock 144 that is local to the primary meter controller 143, then the primary meter controller 143 may request each of the metering devices 126a-N to provide a timestamp 169. Any time differential or time delta between the time set forth by the primary clock 144 and the timestamp 169 is then determined, while accounting for any data communication latency between a respective metering device 126a-N and the primary computing environment 127. Thereafter, the primary meter controller 143 sends a message to the respective metering device 126a-N that directs the respective metering device 126a-N to alter its local clock based upon the time delta calculated.

As an additional alternative, the primary meter controller 143 may send a message to each of the metering devices 126a-N to take action to synchronize their local clocks 361 with external clock 199 to which the primary clock 144 for the primary meter controller 143 is also synchronized. In addition, there may be other approaches used to synchronize the clocks in each of the metering devices 126a-N with the primary clock 144 as can be appreciated. In addition, the primary meter controller 143 may intermittently or periodically synchronize the primary clock 144 with external clock 199 such as an atomic clock that is available over the Internet or other reference clock as can be appreciated.

Once the respective clocks in the primary computing environment 127 and the metering devices 126a-N are synchronized in box 296, the primary meter controller 143 proceeds to box 299 to communicate the configuration data 196 to the respective metering devices 126a-N so that they may be configured for operation in acquiring electromagnetic field measurements 173/176 and generating respective local data records 159 that include such electromagnetic field measurements 173/176. Once each of the metering devices 126a-N have confirmed that they are properly configured for operation, the initial configuration routine of the primary meter controller 143 ends and the operation of the primary meter controller 143 reverts back to box 256 discussed above.

Figure 6:
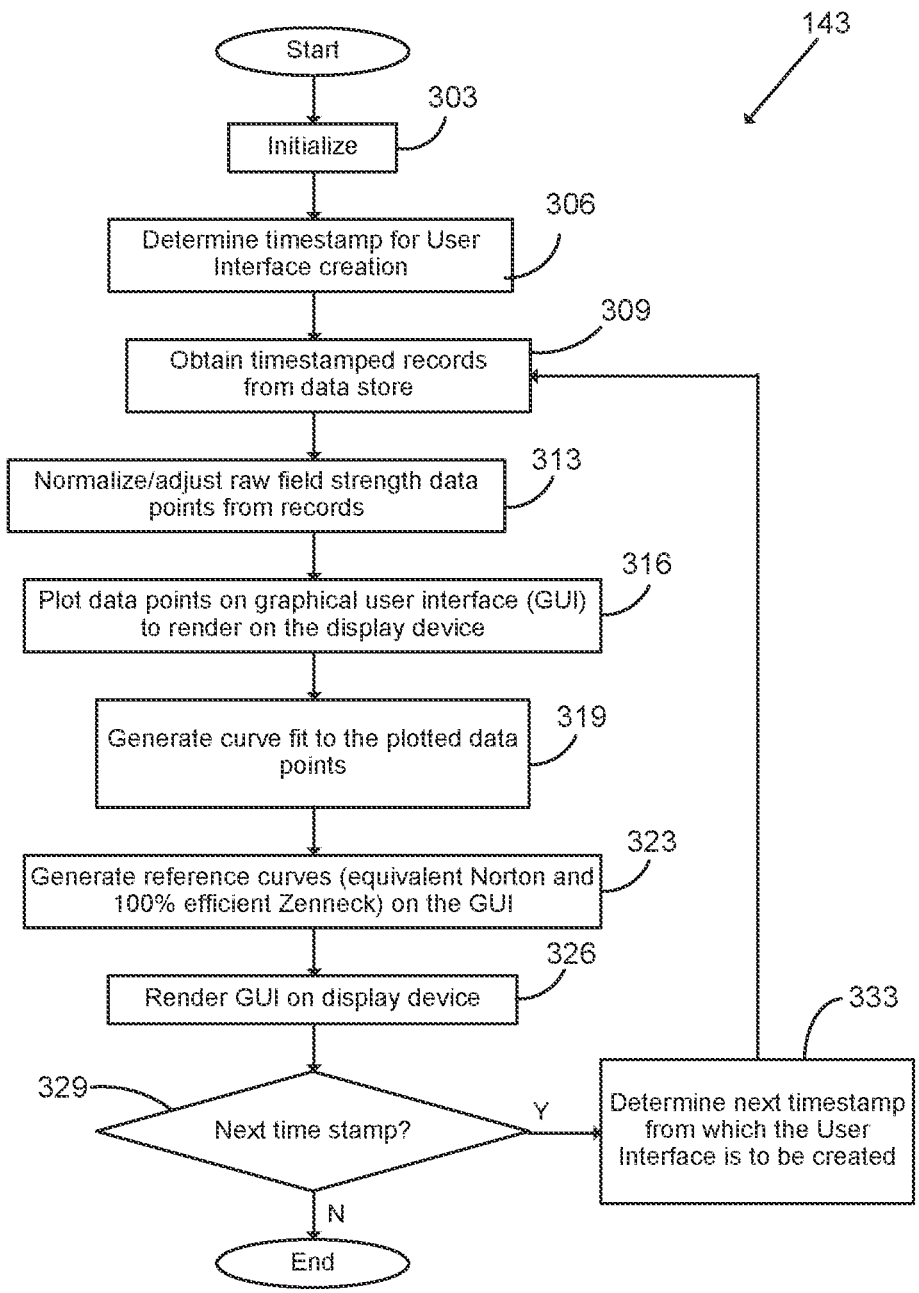
FIG. 6 illustrates a flow diagram example of functionality implemented by the transmission measurement system according to various embodiments of the present disclosure.

FIG. 6 illustrates a flow diagram example of functionality implemented by the transmission measurement system according to various embodiments of the present disclosure. FIG. 6 is an example of many different types of functional arrangements that may be employed to implement the operation of the portion of the primary meter controller 143 as described herein. As an alternative, the FIG. 6 flow diagram may be viewed as depicting an example of steps of a method implemented in the primary computing environment 127 according to one or more embodiments.

At box 303, the primary meter controller 143 initializes operation with respect to generating the graphical user interface 156. At box 306, the primary meter controller 143 determines a timestamp 169 that provides a time at which readings of a given transmitted signal were measured by the metering devices 126a-N and are included in the server records 159 stored in the server data store 146, where the user interface 156 is generated from such readings. In one embodiment, when determining the timestamp 169, the primary meter controller 143 may simply identify the latest timestamp 169 within the server records 159 such that the user interface 156 is generated from the data generated by the most recent attempt to launch a guided surface wave 123. Alternatively, a user may enter a reference time of interest and the primary meter controller 143 may then proceed to identify the timestamp 169 within the server records 159 that is closest to the reference time. To this end, the desired electromagnetic field measurements 173/176 may not be the latest electromagnetic field measurements that are taken if the operator wishes to review the electromagnetic field strength per distance that occurred during a previous test in the past. Alternatively, there may be other approaches used to identify the specific timestamp 169 within the server records 159 that points to a specific record from which data is used to generate the user interface 156.

At box 309 the primary meter controller 143 obtains all of the server records 159 that include such timestamp 169 from the server data store 146. Alternatively, select ones of the electromagnetic field measurements 173/176 in records 159 that have a timestamp 169 within a predefined time tolerance of a predefined time may be used to generate the curve of electromagnetic field strength over distance 226. Alternatively, the electromagnetic field measurements 173/176 in records 159 that were generated by the respective metering devices 126a-N within a predefined time period are used to generate the curve of electromagnetic field strength over distance 226. In addition, other approaches may be used.

At box 313, the primary meter controller 143 may alter or normalize the magnetic or electric field measurements 173/176 of the currently considered server records 159 based upon predefined parameters including but not limited to local weather data 186 and soil sigma 187. For example, it may be the case that respective ones of the metering devices 126a-N are installed at different heights. As a result, the electromagnetic field measurements 173/176 obtained from such metering devices 126a-N might need to be adjusted to account for the height differences given that a guided surface wave 123 can decay exponentially with increasing height above the lossy conducting medium 124. In addition, the physical makeup of the sites where the respective metering devices 126a-N are located such as the makeup of the soil or the presence of man-made structures may affect the measurements taken and a correction factor must be applied to the electromagnetic field measurements 173/176 from a respective record 159. In this manner, the electromagnetic field measurements 173/176 may be adjusted based on a correction factor associated with the respective metering device 126a-N that generated the one or more electromagnetic field measurement(s) 173/176 themselves.

At box 316 respective magnetic and/or electric field measurements 173/176 from the respective server records 159 stored in the server data store 146 are plotted as one or more data points on the graph 223 of the graphical user interface 156 to be rendered on the display device 149. Thereafter, at box 319, the primary meter controller 143 proceeds to generate the near real time curve 226 based upon the current data points on the graphical user interface 156 that is to be rendered on the display device 149. That is to say, each time new data points are plotted in the graph 223, a new near real time curve 226 is generated based upon curve fitting techniques to update the near real time curve 226.

At box 323, the primary meter controller 143 proceeds to generate the reference curves in the graph 223 of the graphical user interface 156 as was mentioned above. In some environments, such reference curves may not be created at all and the functionality of box 323 may be skipped. The reference curves may include, for example, the equivalent radiating wave over distance curve 229 or the maximum efficiency curve 233 mentioned above with reference to FIG. 4.

At box 326 the current graphical user interface 156 embodied in the primary memory 130 of primary computing environment 127 is rendered on the display device 149. If the most recent electromagnetic field measurements 173/176 from the most recently generated server records 159 having the specified timestamp from the respective metering devices 126a-N are included in the graphical user interface 156, then the near real time curve 226 will be as close to real time as possible.

At box 329, the primary meter controller 143 determines whether it is to continue generating the most up-to-date graphical user interface 156 on the display device 149 by determining whether it should proceed to the next most recent timestamp 169. Specifically, it may be the case that the user only wants to see a graph of the readings from a given time without trying to depict the readings over time. Alternatively, the primary meter controller 143 may be directed to create a near real time depiction of the readings from the records 159 as they are created and stored by the metering devices 126a-N. If a near real time depiction of the readings is desired, the primary meter controller 143 proceeds to box 333 where the next timestamp 169 is identified for which the most recent electromagnetic field measurements 173/176 (or other field measurement) taken from the most recent records 159 is to be plotted on the graph 223 of the graphical user interface 156. Thereafter, the primary meter controller 143 reverts back to box 309 as shown. Otherwise, the primary meter controller 143 ends. The determination in box 329 as to whether to end the loop that is used to generate the graphical user interface 156 may depend upon user input that causes the display of the electromagnetic field output of the guided surface waveguide probe 122 to stop.

Figure 7:
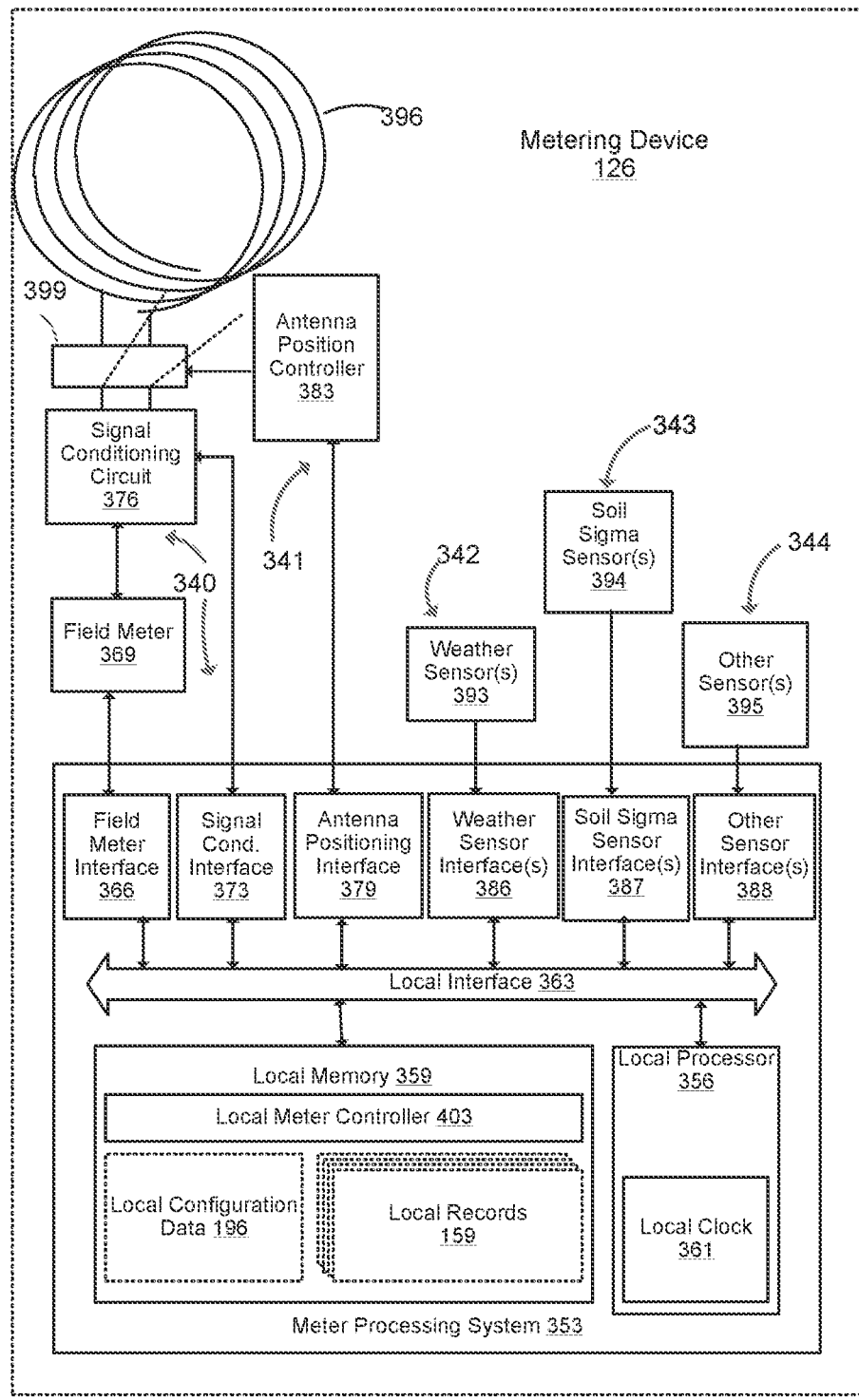
FIG. 7 is a schematic block diagram example of a metering device in the transmission measurement system according to various embodiments of the present disclosure.

FIG. 7 is a schematic block diagram example of a metering device in the transmission measurement system according to various embodiments of the present disclosure. The metering device 126 includes a meter processing system 353 having a processor circuit that includes a local processor 356 and a local memory 359, both of which are coupled to a local interface 363. To this end, the meter processing system 353 may comprise, for example, one or more computing devices such as programmable logic controllers or other computing devices. The local interface 363 may comprise, for example, a data bus with an accompanying address/control bus or other bus structure as can be appreciated.

Stored in the local memory 359 are both data and several components that are executable by the local processor 356. In particular, stored in the local memory 359 and executable by the local processor 356 is the local meter controller, or metering device controller, 403, and potentially other applications. Also, within the processor 356 is a local clock 361 from which timestamps 169 may be generated as described above. Alternatively, the local clock 361 may reside in the local memory 359 and is executable by the local processor 356. In addition, an operating system may be stored in the local memory 359 and executable by the local processor 356.

It is understood that there may be other applications that are stored in the local memory 359 and are executable by the local processors 356 as can be appreciated. Where any component discussed herein is implemented in the form of software, any one of a number of programming languages may be employed such as, for example, C, C++, C#, Objective C, Java, Javascript, Perl, PHP, Visual Basic, Python, Ruby, Delphi, Flash, or other programming languages.

The local meter controller 403 is stored in the local memory 359 and is executable by the local processor 356. In this respect, the term "executable" means a program file that is in a form that can ultimately be run by the local processor

356. Examples of executable programs may be a compiled program that can be translated into machine code in a format that can be loaded into a random access portion of the local memory 359 and run by the local processor 356, source code that may be expressed in proper format such as object code that is capable of being loaded into a random access portion of the local memory 359 and executed by the local processor 356, or source code that may be interpreted by another executable program to generate instructions in a random access portion of the local memory 359 to be executed by the local processor 356, etc. An executable program may be stored in any portion or component of the local memory 359 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The local memory 359 is defined herein as including both volatile and nonvolatile memory and data storage components. Volatile components are those that do not retain data values upon loss of power. Nonvolatile components are those that retain data upon a loss of power. Thus, the local memory 359 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Local processor 356 may also represent multiple processors 356 and the local memory 359 may represent multiple memories 359 that operate in parallel processing circuits, respectively. In such a case, the local interface 363 may be an appropriate network that facilitates communication between any two of the multiple processors 356, between any local processor 356 and any of the local memories 359, or between any two of the local memories 359, etc. The local interface 363 may comprise additional systems designed to coordinate this communication, including, for example, performing load balancing. The processor 356 may be of electrical or of some other available construction.

The meter processing system 353 is configured to support multiple subsystem interfaces coupled through local interface 363. The multiple interfaces can include but are not limited to sensing subsystem interfaces 366, 373, 379, 386, 387, 388 that are any type including but not limited to digital or analog or combinations thereof as a matter of availability and design choice that facilitate meter processing system 353 communications and control of sensor subsystems 340-344.

Electromagnetic field sensor subsystem 340 is in communications with and under the control of meter processing system 353 to facilitate sensing, measuring, and recording of data relating to but not limited to electromagnetic characteristics of a guided surface wave 123 or other type of electromagnetic emission as a matter of configuration and design choice. In one nonlimiting embodiment, the electromagnetic field sensor subsystem 340 includes but is not limited to a electromagnetic field meter interface 366, an antenna 396, and an electromagnetic field meter 369 therebetween. In one nonlimiting embodiment a signal condition circuit 376 can be connected between antenna 396 and the electromagnetic field meter 369 to facilitate signal conditioning that may be helpful or necessary for sensing and measuring low frequency electromagnetic signals. A signal conditioning interface 373 connected between the signal conditioning circuit 376 and the local interface 363 facilitates communication with and the configuration of the signal conditioning circuit 376.

In another nonlimiting embodiment an antenna positioning subsystem 341 can be included to facilitate remote manipulation of antenna 396 where adjusting the physical orientation of the antenna 396 is desirable to optimize sensing and measuring electromagnetic fields. Antenna positioning subsystem 341 can include but is not limited to including an antenna position actuator 399 mechanically connected to antenna 396 to facilitate 180-degree horizontal rotational orientation and/or 90-degree positive/negative vertical elevation orientation of antenna 396.

An antenna position controller 383 is coupled to or integrated within the antenna position actuator 399 as a matter of design choice, to directly control and instruct movements of the antenna position actuator 399. The antenna position controller 383 in any design choice is coupled between the antenna position actuator 399 and the antenna positioning interface 379 to facilitate communication between the meter processing system 353 and the loop position controller 383. Where antenna 396 is a single-axis multi-turn antenna, the antenna positioning subsystem 341 can facilitate orienting antenna 396 remotely. Where antenna 396 is instead a multi-axis antenna, such as a 3-axis multi-turn antenna configured to sense electromagnetic fields in x, y, and z directions, then antenna positioning subsystem 341 can remain present but inactive, or it may be removed from the metering device 126 altogether, as a matter of design choice.

Operationally within antenna positioning subsystem 341, the antenna position controller 383 generates a position signal that is applied to the antenna position actuator 399 to cause antenna 396 to rotate horizontally along the x axis or elevate vertically along the y axis as instructed. The antenna position actuator 399 can provide a feedback signal to the antenna position controller 383 to indicate precise positioning of antenna 396. In this manner, the antenna position controller 383 can know that antenna 396 is positioned optimally relative to guided surface wave 123 transmitted by guided surface waveguide probe 122.

Note that the antenna position actuator 399 can include a compass or other orientation detection apparatus a reference from which the actual positioning of antenna 396 is determined. The antenna position actuator 399 may include various actuators such as stepper motors or other types of motors, gear systems, position sensors, and other components to facilitate movement of antenna 396 and provide feedback as to the current position of the same to the antenna position controller 383. The antenna position actuator 399 working in conjunction with the antenna position controller 383 may position antenna 396 according to a desired positioning tolerance. The positioning tolerance of antenna 396 is specified to ensure that the electromagnetic field measurements 173/176 are accurate within a desired tolerance.

In one nonlimiting embodiment antenna 396 can be a single-axis passive multi-turn antenna. Antenna 396 is passive where there is no signal amplifier within the immediate antenna structure itself thereby further eliminating external noise and signal interference in applications where optimizing signal sensitivity is desirable for sensing low frequency and/or low energy signals. Antenna 396 is a single-axis antenna where it is configured only to sense one aspect of an electromagnetic field such as electric or magnetic field strength, and the optimal orientation of the single-axis antenna is orthogonal to the electromagnetic field being sensed. Antenna 396 is multi-turn where there are at least two wraps of an electrical conductor, such as insulated copper wire, within a nonferrous metal hoop (e.g., aluminum tubing). Multiple turns of wire within the hoop facilitate greater electromagnetic field sensitivity and signal output than a single turn within the hoop can produce. The diameter of the hoop and the number of turns of wire within the hoop are proportional to the frequency of the signal being sensed. According to one embodiment of the present disclosure, antenna 396 includes up to 8 turns of wire within an approximately 750-centimeter hoop for frequencies between approximately 100 kilohertz to 1710 kilohertz. More or fewer turns within a larger or smaller diameter hoop may be employed based on the sensitivity desired for higher or lower frequencies and/or the limits of diminishing returns with respect the practical size of the antenna. Lower frequencies down to 8 kilohertz can require 3 meter or larger hoops with tens of windings of wire therein to meet sensitivity sensing needs. The terminals of a passive multi-turn antenna 396 are coupled to electromagnetic field meter 369 at minimum but may be first coupled through signal conditioning circuit 376 as illustrated in FIG. 7 to amplify and/or filter the sensed signal.

Figure 11:
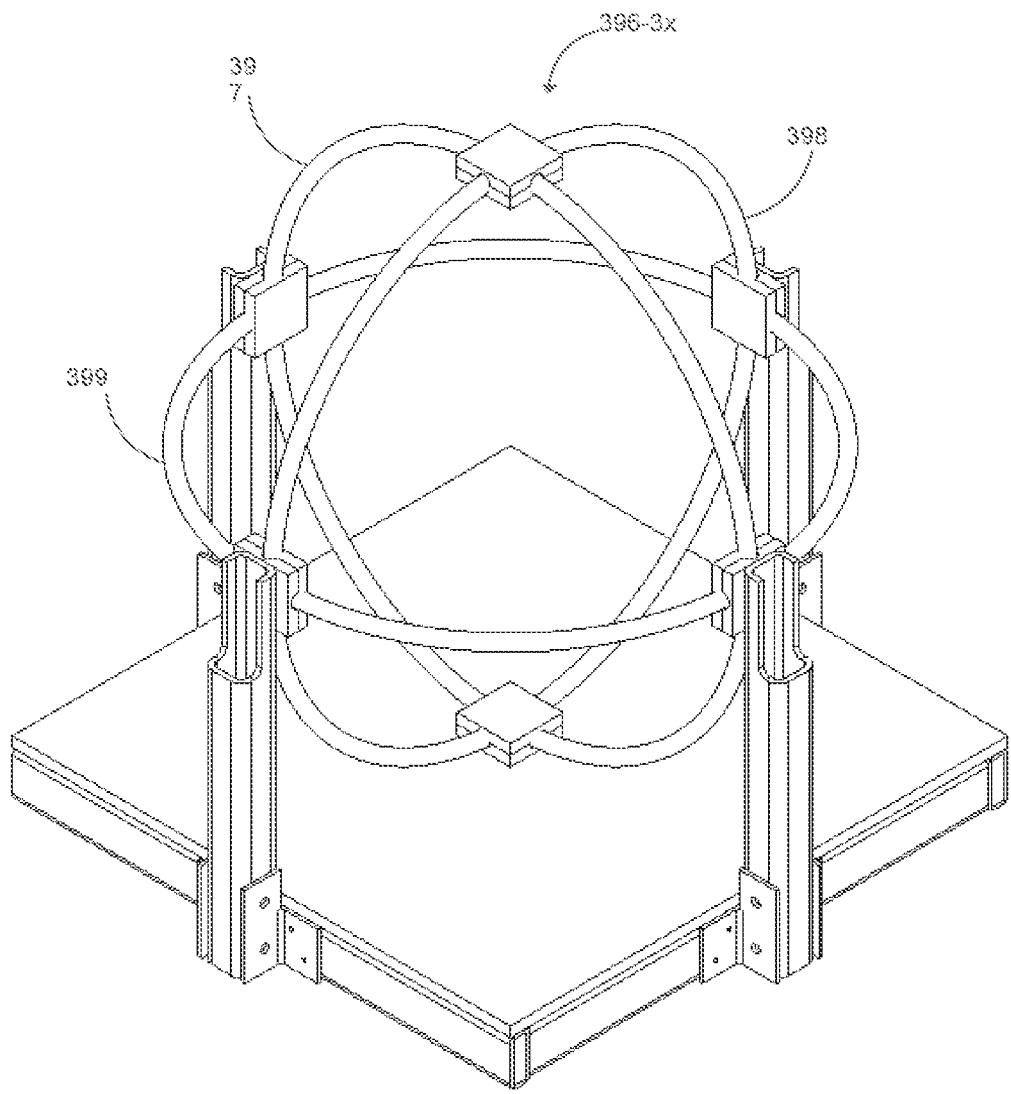
FIG. 11 illustrates an example of a passive multi-axis antenna in the transmission monitoring system according to various embodiments of the present disclosure.

FIG. 11 illustrates an alternative nonlimiting embodiment of antenna 396 configured as a passive multi-axis multi-turn antenna 396-3x (hereafter 3-axis antenna 396-3x). The passive, multi-turn, and hoop size of the 3-axis antenna 396-3x correspond to the disclosure of similar features noted above for the passive single-axis multi-turn antenna 396. The multiple axes aspect of 3-axis antenna 396-3x is the integration of three passive single-axis multi-turn antennas configured as a single functioning receive antenna. The 3-axis antenna 396-3x is comprised of an x-axis antenna 397, a y-axis antenna 398, and a z-axis antenna 399 each in a fixed position at 90 degrees from the other two. This 3-axis antenna 396-3x configuration facilitates sensing the magnetic field strength of guided surface wave 123 regardless of the orientation of the collective antenna. The aggregate signal sensed by each of the three x, y, and z antennas is the signal that is passed through the signal conditioning circuit 376 for conditioning as needed and then measured by the electromagnetic field meter(s) 369 regardless of any one antenna's orientation relative to the transmission source.

When the 3-axis antenna 396-3x is used as the antenna 396 for metering device 126 at a fixed location along the lossy conductive medium 124, the antenna positioning subsystem 341 is not needed and can be eliminated from the fixed location metering devices 126a-N altogether. Alternatively, the antenna positioning subsystem 341 can be rendered inactive if it remains present in the metering device 126. There is no need to optimally orient the 3-axis antenna 396-3x toward the transmission source as there was with the single-axis antenna 396 that required orthogonal positioning relative to the transmission source for optimal performance.

Additional features and characteristics that distinguish the 3-axis antenna 396-3x of the present disclosure from other 3-axis antennas that may be similar in appearance, include but are not limited to: 1) design features that collectively optimize the sensitivity of antenna 396-3x to low frequency electromagnetic output of less than 1710 Kilohertz down to 1 Kilohertz emitted from a transmission source external to antenna 396-3x in an uncontrolled field environment; 2) multiple windings of wire within shielded x, y, and z hoops to minimize the multitude of external natural and man-made electromagnetic noise that exists around a metering device 126 location that can otherwise interfere with sensing a low frequency target signal transmitted tens of kilometers to thousands of kilometers away from a metering device 126 location for frequencies from 100 kilohertz down to 1 kilohertz; 3) in one embodiment of the present disclosure up to eight windings of the conductor within each of the x, y, and z hoops of approximately 750 centimeters diameter to maximize sensitivity to an external low frequency target signal in an uncontrolled field environment; 5) a passive antenna configuration that is free of nearby electronic components that are not electrically isolated from the antenna hoops themselves; and 6) utilizing at least one spectrum analyzer rather than a volt meter as the electromagnetic field meter 369 within the electromagnetic field sensor subsystem 340 to facilitate trace measurements and sensed signals that are off the target frequency due to influences of conductivity and permittivity of the air and soil local to the metering device 126.

The 3-axis antenna 396-3x also allows a metering device 126 to be configured for mobile deployment in a ground-based or airborne vehicle. Mobile deployment of at least one mobile metering device 126 may be desirable where there are none or very few operational metering devices 126a-N available in fixed positions along the lossy conducting medium 124 relative to the guided surface waveguide probe 122. Given any quantity or positioning of fixed position metering devices 126a-N, the deployment of one or more metering devices 126 made mobile due to the 3-axis antenna 396-3x supplements the collected meter measurement data 153 with continuous data across potentially wide areas between fixed position metering devices 126a-N.

In an alternative nonlimiting embodiment, a mobile metering device 126 can be used to traverse gaps between fixed position metering devices 126a-N while providing continuous real-time sensing and measuring of the guided surface wave 123 while in motion. This continuous real-time sensing and measuring while in motion produces data locally stored in local records 159 and is synchronized with time stamps 169 in the same manner as disclosed with fixed position metering devices 126a-N. Local records 159 are also transmitted from a mobile metering device 126 to the primary meter controller 143 via a wireless connection to network 133 in a manner similar to the counterpart fixed position metering devices 126a-N. The weather sensor subsystem 342 of a mobile metering device 126 is also configured to continuously sense and measure weather and atmospheric conditions local to the mobile metering device 126 even while in motion. A global positioning system sensor 395 can provide meter location 179 data to coordinate with timestamps 169 associated with electromagnetic field measurements 173/176 and weather sensing data 186.

Soil sigma subsystem 343 sensing and measurements can be estimated along the path of a mobile metering device 126 based on direct measurements collected by fixed position metering devices 126a-N proximate to points along the path of the mobile metering device 126. Alternatively, or in addition to estimates of soil sigma at any given point along the path of mobile metering device 126, soil sigma data 187 can be supplemented with direct measurements collected intermittently or periodically at fixed locations along the path of mobile metering device 126 either by a third party as the conveying vehicle passes by, or by the driver of the conveying vehicle when stopped or at rest. By analyzing the moisture content or lack of moisture recorded in weather sensing data 186 along with an increasing record of direct measurements of soil sigma data 187 along the path of mobile metering device 126*a*-N, an accurate mapping can be produced regarding the estimated conductivity and permittivity of soil along the path of at least one mobile metering device 126. Mobile weather sensing data 186 and direct and/or estimated mobile soil sensing data 187 can be used to adjust and normalize raw electromagnetic field measurements 173/176 in view of the relative influence that conductivity and permittivity of air and soil has on the guided surface wave 123 along the path of mobile metering device 126.

In another nonlimiting embodiment a weather sensing subsystem 342 can be included to facilitate sensing and measuring weather and atmospheric conditions local to the metering device 126 in a fixed location. The weather sensing subsystem 342 can include but is not limited to or required to include sensors each coupled to at least one weather sensor interface 386 for communication with the meter processing system 353.

In another nonlimiting embodiment a soil sigma subsystem 343 can be included to facilitate sensing and measuring conductivity and permittivity of soil local to the fixed position of metering device 126. The soil sigma sensor(s) 394 are each coupled to at least one soil sensor interface 387 for communication with the meter processing system 353.

In another nonlimiting embodiment other sensing subsystems 344 can be included to facilitate sensing and measuring of other factors local to the metering device 126. The other sensor(s) 395 are each coupled to at least one soil sensor interface 388 for communication with the meter processing system 353.

The local meter controller 403 is executed by the processor 356 to implement the functions of the metering device 126 as will be described. In addition, various data resides in the memory 359. Such data may include, for example, the configuration data 196 and the records 159. Other executable systems may be stored on the memory 359 as is needed for the proper operation of the meter processing system 353 such as, for example, an operating system or other executable system. In addition, other data may be stored in the memory 359 in association with the operation of the local meter controller 403 as can be appreciated.

If the records 159 are stored in the memory 359, then the metering device 126 includes buffering capability as described above, where the memory 359 acts as the buffer memory. The configuration data 196 is used to configure the operation of the metering device 126 as was described.

Given the foregoing description of the metering device 126, next a general description of the operation of the same is set forth. The local meter controller 403 communicates with the primary meter controller 143 to synchronize the local clock 361 with the primary clock 144 and to obtain the configuration data 196 that is used to configure the operation of the metering device 126. The synchronization of the local clock 361 with the primary clock 144 is performed in accordance with one of the approaches described above.

The configuration data 196 may specify a number of parameters for the operation of the metering device 126. For example, the configuration data 196 may specify the operating frequency at which electromagnetic field measurements 173/176 are to be taken. Also, nature of an electromagnetic field measurement traces to be taken using the electromagnetic field meter 369 may be specified including the low frequency, high frequency, and center frequency of the traces to be taken. Also, the number of electromagnetic field measurements 173/176 that are to be taken between the low and high frequencies may be specified. The configuration data 196 may further specify the desired position of antenna 396. The configuration data 196 may include other information as will be described.

Once the configuration data 196 is received, the metering device 126 is configured for operation. To this end, the electromagnetic field meter 369 is configured for operation by inputting the relevant parameters into the electromagnetic field meter 369 according to a predefined communications protocol of the electromagnetic field meter 369. The range of frequencies that can be sensed by the metering device 126 is specified by the electromagnetic field meter 369. According to one embodiment of the present disclosure, the electromagnetic field meter 369 is configured to generate electromagnetic field strength measurements 173/176 at frequencies from approximately 6 Kilohertz to 120 Kilohertz, for example, although other frequency ranges may be specified.

Alternatively, other ranges may be specified. In one embodiment, the electromagnetic field meter 369 is configured to generate electromagnetic field measurements 173/176 at or below 50 Kilohertz.

In some embodiments, each of the electromagnetic field meter 369 comprises a spectrum analyzer. The electromagnetic field meter 369 is configured to generate electric and magnetic field measurements 173/176 on 6 axes. To this end, the passive multi-turn antenna 396 is representative of multiple such antennas that may be coupled to the electromagnetic field meter 369. In addition to loop antennas, linear antennas may also be coupled to the electromagnetic field meter 369 such that electric field measurements 173 may be taken in up to 6 directions. Thus, antenna 396 is representative of different antenna structures and types that may be employed with the electromagnetic field meter 369.

The data configuration 196 may also include information used to specify the state of the components in the signal conditioning circuit 376 as will be described.

Once the metering device 126 has been fully configured based upon the configuration data 196 received from the primary meter controller 143, the metering device 126 proceeds to take electromagnetic field strength measurements 173/176 at the direction of the primary meter controller 143. When directed to do so, the metering device 126 generates magnetic and/or electric field strength measurements 173/176 across one or more axes. Such magnetic and/or electric field strength measurements 173/176 are included in a local record 159 along with other information based on readings from the sensors 393 and information from other sources.

Once a local record 159 is generated with the electromagnetic field strength measurement(s) 173/176, the local record 159 is downloaded to the primary meter controller 143 to be stored in the server data store 146. In this manner, the metering device 126 transmits the electromagnetic field strength measurement(s) 173/176 to a remote computing device comprising the primary computing environment 127 through the network 133. In one embodiment, the metering device 126 generates a local record 159 with one or more electromagnetic field strength measurements 173/176 and sends the same to the primary meter controller 143 executed on the primary computing environment 127 in response to a request from the primary meter controller 143. In another embodiment, the metering device 126 automatically generates a continuous stream of electromagnetic field strength measurements 173/176 at the direction of the primary meter controller 143 that are included in a corresponding number of local records 159 that are stored in the local memory 359 that acts as a data buffer. The metering device 126 intermittently or periodically downloads the buffered local records 159 upon request by the primary meter controller 143 executed on the primary computing environment 127.

Figure 8:
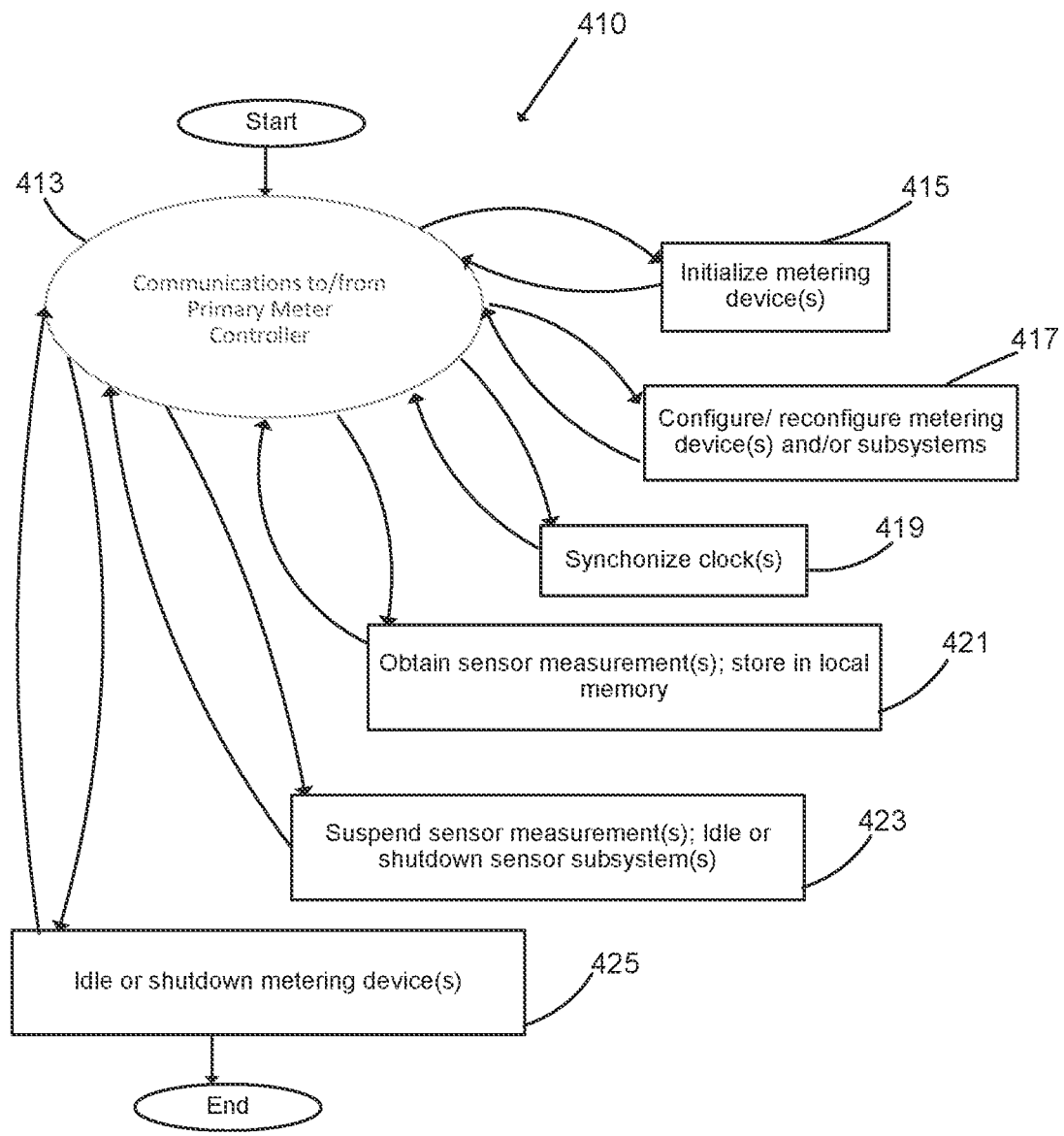
FIG. 8 illustrates a state diagram example of functionality implemented by a metering device according to various embodiments of the present disclosure.

FIG. 8 illustrates a state diagram example of functionality implemented by a metering device according to various embodiments of the present disclosure. Operations among devices can proceed serially or in parallel according to various aspects of the present disclosure. It is understood that state diagram 410 is one example of the many different types of functional arrangements that may be employed to implement the operation of the local meter controller 403 as described herein. In addition, local meter controller 403 may include additional functionality not discussed herein. As an alternative, state diagram 410 may be viewed as depicting example steps of a monitoring method implemented in the meter processing system 353 in some embodiments to monitor operational status of metering devices that include at least one mobile metering device and at least one fixed position metering device, one or more metering device systems, and at least one measurement sensor subsystem under operational control of the plurality of metering devices, and to remotely request: activating or deactivating one or more of the metering devices, or one or more metering device systems or measurement sensor subsystems, under operational control of one of the plurality of metering devices; verifying a configuration of one or more of the metering devices, or one or more metering device system or measurement sensor subsystem, under operational control of one of the metering devices; configuring one or more of the metering devices, or one or more metering device system or measurement sensor subsystem, under operational control of one of the plurality of metering devices; and downloading the measurement data obtained by one or more measurement sensor subsystem of one or more of the metering devices.

From the start of operation in state 413 primary meter controller 143 is operational and configured for communications with each of the metering devices 126a-N by way of network 133. Where primary meter controller 143 determines that one or more of the metering devices 126a-N requires initialization to begin operation, primary meter controller 143 sends initialization instructions to the respective one or more metering devices 126a-N and operation continues at state 415. As the local meter controller 403 of each of the one or more metering devices 126a-N confirms that initialization is complete, operation returns to state 413.

From state 413 primary meter controller 143 may determine the need for one or more of the metering devices 126a-N and/or their respective sensor subsystems to be configured, primary meter control 143 sends configuration instructions to the respective one or more metering devices 126a-N and respective ones of the local meter controller 403 proceed with configuration operations at state 417. As each local meter controller 403 confirms that configuration operations are complete, operation returns at state 413.

From state 413 primary meter controller 143 may determine the need for one or more of the metering devices 126a-N to synchronize their local clock 361, primary meter controller 143 sends synchronization instructions to the respective one or more metering devices 126a-N and respective ones of the local meter controller 403 proceed with clock synchronization operations at state 419. As each local meter controller 403 confirms that clock synchronization operations are complete, operation returns at state 413.

From state 413 primary meter controller 143 may determine the need for one or more of the sensor subsystems of one or more metering devices 126a-N to begin sensor measurements, primary meter controller 143 sends commence measurement instructions to the respective one or more metering devices 126a-N and respective ones of the local meter controller 403 proceeds to start the respective sensor subsystems at state 421. Each local meter controller 403 confirms with primary meter controller 143 that sensor subsystem measurements are initiated, and measurement storing is initiated in local memory, and respective metering device 126 measuring/storing operations proceed in state 421 in parallel with primary meter controller 143 continuing activities in state 413. Among further operations by primary meter controller 143 in state 413 is to request ongoing or periodic downloads of local records 159 from one or more local meter controllers 403. Further, primary meter controller 143 can at any time initiate parallel instructions for any one or more of the metering devices 126a-N to reconfigure its operating parameters or sensor subsystem configurations in state 417, or request further clock synchronization at state 419, and the like.

From state 413 primary meter controller 143 may determine the need for one or more of the metering devices 126a-N to suspend or shut down sensor measurements or one or more sensor subsystems. Primary meter controller 143 sends suspend or shutdown instructions to the respective one or more metering devices 126a-N, and respective ones of the local meter controller 403 proceed with suspension and/or shutdown operations at state 423. As each local meter controller 403 confirms that suspension and/or shutdown operations are complete, operation returns at state 413.

Similarly, the primary meter controller 143 may determine the need for one or more of the metering devices 126a-N to idle all systems and subsystems or to shut down entirely. Primary meter controller 143 sends idle or shutdown instructions to the respective one or more metering devices 126a-N, and respective ones of the local meter controller 403 proceed idle all systems and subsystems, or to shut down operations entirely at state 425. As each local meter controller 403 confirms that idling is achieved, the respective metering devices proceed to idle at state 425 until further instruction from the primary meter controller 143 (e.g., new initialization or configuration instructions). For respective metering devices 126a-N instructed to shut down entirely, processing ends at state 425.

FIG. 9 illustrates an example of the configuration data 196 for metering devices 126a-N to configure the various components of such metering devices 126a-N and their respective sensor subsystems 340-344 for operation. The configuration data 196 is input by a user into the primary meter controller 143 for delivery to metering devices 126a-N for initialization and configuration.

The configuration data 196 includes but is not limited to settings for all aspects of a metering device 126 and all sensor subsystems 340-344. Examples include a "Name of Test" field to identify a specific test run of a given guided surface waveguide probe 122. The "Name of Test" field may include, for example, a frequency of operation and/or a date upon which the test is to occur, and any other identifying information desired.

Configuration data 196 can further include a setting for a center frequency and a span of an electromagnetic field measurement trace to be obtained when electromagnetic field measurements 173/176 are generated. Alternatively, the electromagnetic field measurement trace may be specified with a center frequency along with low and high frequencies, or the electromagnetic field measurement trace may be specified in some other manner. The configuration data further includes a "Resolution Bandwidth" that indicates the selectivity and noise sensitivity of the electromagnetic field meter 369 in Hertz.

Further electromagnetic fields in the configuration data 196 include a reference level and units of measurement. The reference level identifies the amplitude threshold of the electromagnetic field meter 369. The units of measurement indicate the units of the electromagnetic field measurements 173/176 such as millivolts per meter (mV/m) or other units. The configuration data 196 also includes antenna position information that may be expressed as degrees from a fixed reference point such as degrees from North, where North may be determined from an electronic compass as described above. The configuration data 196 may further specify the state of various components such as amplifiers (preamps), switches, filter circuits, attenuation circuitry, and other components in the signal conditioning circuit 376 (FIG. 7). In addition, other parameters and settings for other sensor subsystems 340-344 may be specified in the configuration data 196.

Figure 10:
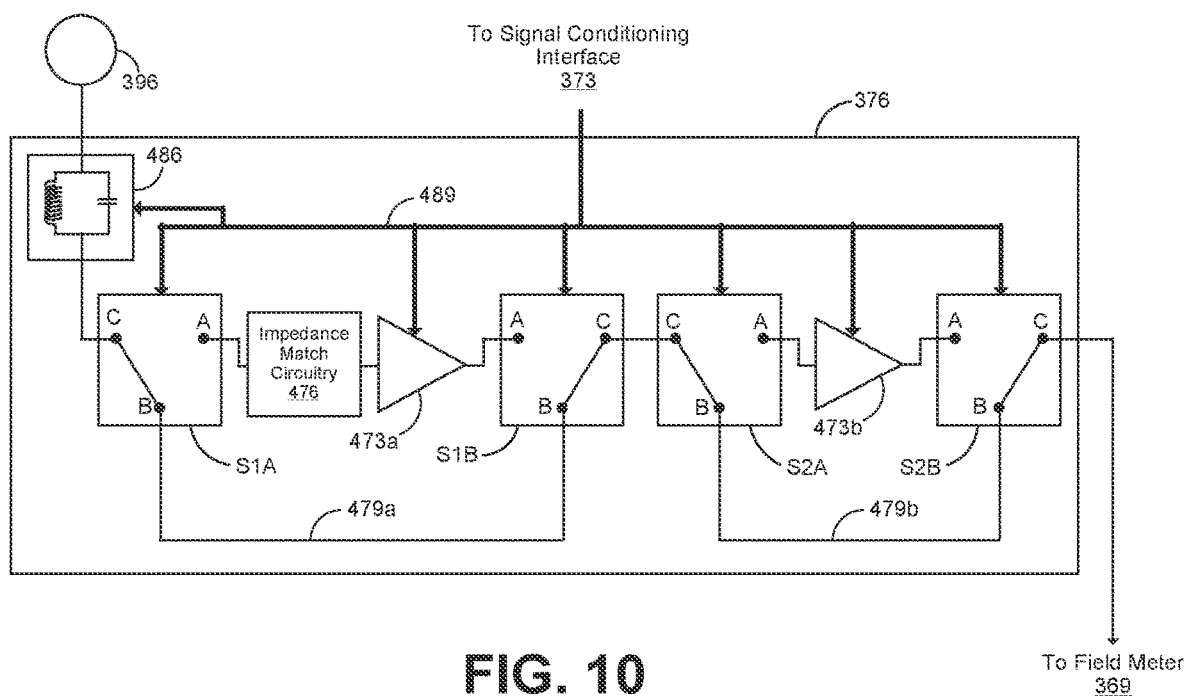
FIG. 10 is a schematic diagram of one example of the signal conditioning circuit according to various embodiments of the present disclosure.

FIG. 10 is a schematic diagram of one example of the signal conditioning circuit 376 according to various embodiments of the present disclosure. The signal conditioning circuit 376 facilitates both the electronic filtering of signals from antenna 396 and the amplification of such signals before they are applied to the electromagnetic field meter 369.

The signal conditioning circuit 376 includes at least two amplifiers, denoted herein as first stage amplifier 473a and second stage amplifier 473b. The signal conditioning circuit 376 also includes four radio frequency (RF) switches organized into two pairs denoted herein as the RF switches S1A, S1B, S2A, and S2B. The first and second stage amplifiers 473a and 473b may comprise, for example, RF amplifiers or other types of amplifiers. The first and second stage amplifiers 473a and 473b may also be configured as active filters to reduce noise. In one example, the first and second stage amplifiers 473a and 473b may each comprise, for example, a wideband low noise Amplifier model HD24540 manufactured by HD Communications Corporation of Holbrook, New York.

The signal conditioning circuit 376 further includes impedance match circuitry 476 that provides for impedance matching as can be appreciated. The impedance match circuitry 476 is coupled to the signal input of the first stage amplifier 473a as will be described. The signal conditioning circuit 376 further includes a filter circuit 486 that eliminates unwanted spurious signals from the desired signal received from antenna 396 as will be described. The local meter controller 403 causes the signal conditioning interface 373 to send one or more signals to the signal conditioning circuit 376 that control the operation of the first and second stage amplifiers 473a and 473b, the RF switches S1A/S1B/S2A/S2B, the filter circuit 486, and potentially other components as will be described. In this manner, the local meter controller 403 controls the operation of the components in the signal conditioning circuit 376.

The input signal from antenna 396 is coupled to the filter circuit 486. The filter circuit 486 receives a control input from local meter controller 403 through signal conditioning interface 373. This control input configures the operation of the filter circuit 486. For example, filter circuit 486 may include a plurality of different low pass filters, where each low pass filter has a different cutoff frequency. In one embodiment, the control input from the signal conditioning interface 373 selects one of such low pass filters to be placed in the circuit pathway so that the desired low frequencies pass through the filter circuit 486 and high frequencies about the cutoff point are dissipated accordingly.

Filter circuit 486 may also include other types of filters such as band pass filters, notch filters, or other types of filters. Such filters may be static in nature or configurable to provide for various filtering options depending on the frequency of the transmitted signals that are to be acquired by antenna 396. The ultimate operation of the filter circuit 486 may be controlled by control signals generated by the signal conditioning interface 373 as directed by the local meter controller 403. Such control signal is applied to the filter circuit 486 to specify the desired filtering to be performed by the filter circuit 486. The signal output from the filter circuit 486 is applied to an input of the RF switch S1A as shown. Alternatively, the filter circuit 486 may not be employed at all. In such case, the signal output of antenna 396 may be applied directly to the input of the RF switch S1A.

Each of the RF switches S1A, S1B, S2A, and S2B include an A node and a B node as shown. When the RF switch S1A is in the A state, the common node C of the RF switch S1A is coupled to the A node, thereby applying the input from antenna 396 to an input of impedance match circuitry 476. The output of the impedance match circuitry 476 is coupled to a signal input of the first stage amplifier 473a. When in the B state, the common node C of the RF switch S1A is applied to node B of the RF switch S1A. In this manner, the first stage amplifier 473a is bypassed by bypass conductor 479a.

The output of the first stage amplifier 473a is applied to the A node of the RF switch S1B. When in the A state, the A node of the RF switch S1B is coupled to a common node C of the RF switch S1B. When in the B state, the B node of the RF switch S1B is coupled to the common node C of the RF switch S1B. The common node C of the RF switch S1B is coupled to a common node C of the RF switch S2A as shown.

According to one embodiment, the RF switches S1A and S1B are both placed into either the A state or the B state simultaneously. When both RF switches S1A and S1B are in the A state, the input signal from antenna 396 is applied to the impedance match circuitry 476 and the first stage amplifier 473a. When both RF switches S1A and S1B are in the B state, the input signal from antenna 396 is routed around the impedance match circuitry 476 and the first stage amplifier 473a by way of the bypass conductor 479a.

When in the A state, the common node C of the RF switch S2A is coupled to the A node of RF switch S2A which, in turn, is coupled to a signal input of the RF switch S2A. When in the B state the common node C of the RF switch S2A is coupled to the B node of RF switch S2A which, in turn, is coupled to bypass conductor 479b that facilitates bypassing the second stage amplifier 473b.

The signal output of the second stage amplifier 473b is coupled to an A node of the RF switch S2B. The bypass conductor 479b is coupled to the B node of the RF switch S2B. When in the A state, node A of the RF switch S2B is coupled to the common node C of the RF switch S2B, thereby coupling the signal output of the second stage amplifier 473b to the electromagnetic field meter 369 that is coupled to the common node C of the RF switch S2B. When in the B state, node B of the RF switch S2B is coupled to the common node C of the RF switch S2B, thereby coupling the bypass conductor 479b to the electromagnetic field meter 369 coupled to the common node C of the RF switch S2B.

According to one embodiment, the RF switches S2A and S2B are both placed into either the A state or the B state simultaneously. When both RF switches S2A and S2B are in the A state, the input signal at common node C of the RF switch S2A is applied to the second stage amplifier 473b. When both RF switches S2A and S2B are in the B state, the input signal at common node C of the RF switch S2A is routed around the second stage amplifier 473b by way of the bypass conductor 479b.

According to one embodiment, the signal conditioning circuit 376 can be placed in one of three states for the operation of the amplifiers included therein. As an additional alternative, the local meter controller 403 may implement an initial configuration routine with respect to the signal conditioning circuit 376. Specifically, a signal may be transmitted from a guided surface waveguide probe 122 and pre-amplifiers in the signal conditioning circuit 376 may be switched in or out of the circuit until an acceptable signal is input to the electromagnetic field meter 369.

The operational states of signal conditioning circuit 376 are controlled by local meter controller 403 that sends control signals through a control signal bus 489 coupled to the signal conditioning interface 373.

In a first state, the signal received from antenna 396 is routed directly to the electromagnetic field meter 369 without amplification by either one of the first or second stage amplifiers 473a-473b. The local meter controller 403 causes RF switches S1A and S1B associated with the first stage amplifier 473a to be placed in the B state. The RF switches S2A and S2B associated with the second stage amplifier 473b are also placed in the B state. Also, the first and second stage amplifiers 473 are disabled. In this configuration, the signal received from antenna 396 is routed through the filter circuit 486, if any, and directed to the electromagnetic field meter 369, bypassing both the first and second stage amplifiers 473a-473b. In this respect, the RF switches S1A, S1B, S2A, and S2B route the signal received from antenna 396 through bypass conductors 479a-479b, thereby coupling antenna 396 directly to the output of the signal conditioning circuit 376 to electromagnetic field meter 369.

The bypass conductors 479a and 479b are labeled "bypass conductors" because the amplifiers 473a-473b are bypassed accordingly. In the first state, the amplifiers 473a-473b are electrically isolated from the signal path leading from antenna 396 to electromagnetic field meter 369.

In a second state, the signal received from antenna 396 is routed through the impedance match circuitry 476 and the first stage amplifier 473a while bypassing the second stage amplifier 473b. The signal from antenna 396 is amplified by one of the first and second stage amplifiers 473a/473b. The local meter controller 403 causes RF switches S1A-S1B to be placed in the A state and causing RF switches S2A-S2B to be placed in the B state.

In this second state, the signal from antenna 396 is routed through the filter circuit 486, if any, to an input of the impedance match circuitry 476 and first stage amplifier 473a. The output of the first stage amplifier 473a is routed directly to the electromagnetic field meter 369 via bypass conductor 479a. The first stage amplifier 473a is enabled and the second amplifier 473b is disabled. Because RF switches S2A-S2B are in the B state, the second stage amplifier 473b is electrically isolated from the circuit.

In a third state, the signal received from antenna 396 is routed through the impedance match circuitry 476 and both amplifiers 473a-473b for maximum amplification and/or filtering of the signal. The local meter controller 403 causes all of the RF switches S1A, S1B, S2A and S2B to be placed in the A state so the signal from antenna 396 is routed through the filter circuit 486, if any, and through the imped-ance match circuitry 476 to then both amplifiers 473a-473b in series and output directly to electromagnetic field meter 369. The first and second stage amplifiers 473a and 473b are both enabled.

With respect to the foregoing, a phrase, such as "at least one of X, Y, or Z," unless specifically stated otherwise, is to be understood with the context as used in general to present that an item, term, etc., can be either X, Y, or Z, or any combination thereof (e.g., X, Y, and/or Z). Similarly, "at least one of X, Y, and Z," unless specifically stated otherwise, is to be understood to present that an item, term, etc., can be either X, Y, and Z, or any combination thereof (e.g., X, Y, and/or Z). Thus, as used herein, such phrases are not generally intended to, and should not, imply that certain embodiments require at least one of either X, Y, or Z to be present, but not, for example, one X and one Y. Further, such phrases should not imply that certain embodiments require each of at least one of X, at least one of Y, and at least one of Z to be present.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present disclosure defined in the following claims, the scope of which are to be accorded the broadest interpretation so as to encompass modifications and equivalent structures.

What is claimed is:

1. A system, comprising:
    a plurality of metering devices positioned along a lossy conducting medium relative to a guided surface wave transmission source, each of the plurality of metering devices being configured with at least one measurement sensor subsystem to obtain measurement data relevant to a guided surface wave from the guided surface wave transmission source and a timestamp reflecting the time when the measurement data was obtained; and
    at least one mobile metering device among the plurality of metering devices deployable on request to obtain measurement data relevant to the guided surface wave to supplement the measurement data obtained by at least one additional of the plurality of metering devices, with the measurement data obtained by the at least one mobile metering device along the lossy conducting medium while deployed in motion or at rest.

2. The system of claim 1 wherein the at least one mobile metering device and the at least one additional of the plurality of metering devices are operably coupled with an at least 3-axis passive multi-loop antenna and include an antenna interface configured to self-adjust reception of the guided surface wave independent of directional orientation of the at least 3-axis passive multi-loop antenna relative to the guided surface wave transmission source.

3. The system of claim 1, further comprising:
    at least one primary computing environment configured for connecting at least intermittently to the plurality of metering devices by way of a network, the at least one primary computing environment being configured to at least remotely:
        activate or deactivate one or more of the plurality of metering devices or subsystems;
        verify a configuration for one or more of the plurality of metering devices or subsystems;

configure any of the plurality of metering devices or subsystems; and download the measurement data obtained by one or more of the plurality of metering devices.

4. The system of claim 3, wherein the at least one primary computing environment is further configured to:

determine, using the downloaded measurement data a normalized field strength over distance curve over time of the guided surface wave relative to a theoretic field strength over distance curve over time; and generate a user interface configurable for real-time display or replay display, indicating the normalized field strength over distance curve over time relative to the theoretic field strength over distance curve over time.

5. The system of claim 1, wherein the at least one measurement sensor subsystem includes one or more of an electric field sensor, magnetic field sensor, atmospheric condition sensors, and soil sigma sensor.

6. A method, comprising:

controlling conveyance of at least one mobile metering device along a lossy conducting medium, the at least one mobile metering device being configured with a first measurement sensor subsystem; and obtaining a first set of measurement data attributable to a respective one of the at least one mobile metering device, while in motion or conveyed to an at rest position along the lossy conducting medium, relevant to a guided surface wave from a guided surface wave transmission source.

7. The method of claim 6, further comprising:

configuring at least one fixed position metering device deployed along the lossy conductive medium relative to the guided surface wave transmission source, including configuring the at least one fixed position metering device with a second measurement sensor subsystem; and obtaining a second set of measurement data attributable to a respective one of the at least one fixed position metering device relevant to the guided surface wave from the guided surface wave transmission source.

8. The method of claim 6, further comprising:

configuring at least one primary computing environment to monitor operational status of a plurality of metering devices that include the at least one mobile metering device and at least one fixed position metering device, one or more metering device system, and the at least one measurement sensor subsystem under operational control of the plurality of metering devices, and to remotely request:

activating or deactivating one or more of the plurality of metering devices, or one or more metering device system or the at least one measurement sensor subsystem, under operational control of one of the plurality of metering devices;

verifying a configuration of one or more of the plurality of metering devices, or one or more metering device system or the at least one measurement sensor subsystem, under operational control of one of the plurality of metering devices;

configuring one or more of the plurality of metering devices, or one or more metering device system or the at least one measurement sensor subsystem, under operational control of one of the plurality of metering devices; and downloading the measurement data obtained by the at least one measurement sensor subsystem of one or more of the plurality of metering devices.

9. The method of claim 8, wherein the at least one primary computing environment is further configured to:

analyze the measurement data downloaded from the plurality of metering devices;

normalize a field strength over distance curve over time of the guided surface wave relative to a theoretic field strength over distance curve over time; and generate a user interface configurable for real-time display or replay display, depicting the normalized field strength over distance curve over time relative to the theoretic field strength over distance curve over time.

10. The method of claim 8, wherein the at least one measurement sensor subsystem includes one of an electric field sensor, magnetic field sensor, atmospheric condition sensors, and soil sigma sensor.

11. A metering device comprising:

an at least 3-axis passive multi-loop antenna configured to self-adjust reception of a guided surface wave independent of directional orientation of the at least 3-axis passive multi-loop antenna at a fixed location or while in motion affixed to a conveyance relative to a guided surface wave transmission source;

at least one measurement sensor subsystem configured to obtain measurement data relevant to a guided surface wave from a guided surface wave transmission source; and a metering device controller having one or more processors and at least one memory storing executable instructions that, if executed by the one or more processors, cause the one or more processors to perform one or more operations on at least one system or subsystem within operational control of the metering device.

12. The metering device of claim 11, wherein the at least one measurement sensor subsystem includes one or more of an electromagnetic field sensor subsystem, an atmospheric condition sensor subsystem, and a soil sigma sensor subsystem.

13. The metering device of claim 11, wherein:

the at least one measurement sensor subsystem comprises at least an electromagnetic field sensor subsystem:

the at least 3-axis passive multi-loop antenna is further configured to generate an output signal indicative of at least one electromagnetic component of the guided surface wave in response to receiving electromagnetic energy from the guided surface wave via the electromagnetic field sensor subsystem; and the at least one measurement sensor subsystem further comprises:

an electromagnetic field sensing meter configurable to generate magnetic field component measurements and electric field component measurements at frequencies as low as 1 Kilohertz; and a signal conditioning circuit comprising at least one signal amplifier and at least one bypass conductor, the signal conditioning circuit being electrically coupled between the at least 3-axis passive multi-loop antenna and an electromagnetic field sensing meter such that the output signal generated by the at least 3-axis passive multi-loop antenna passes through the signal conditioning circuit to the electromagnetic field sensing meter.

14. The metering device of claim 13, wherein the executable instructions, if executed by the one or more processors, cause the one or more processors to perform one or more further operations comprising:

communicating, by way of a network, with at least one primary computing environment located remotely from the metering device;

alternatively coupling, in response to a coupling configuration request from the at least one primary computing environment, one of the at least one amplifier and one of the at least one bypass conductor between the 3-axis passive multi-loop antenna and the electromagnetic field sensing meter;

performing and reporting on, in response to a configuration verification request received from the at least one primary computing environment, configuration status and settings for one or more system or subsystem within operational control of the metering device;

implementing and reporting on, in accordance with configuration data and a configuration request received from the at least one primary computing environment, at least one configuration setting for one or more system or subsystem within operational control of the metering device;

activating or deactivating, in accordance with an activate/deactivate request received from the at least one primary computing environment, the metering device or one or more system or subsystem within operational control of the metering device;

generating and storing in a local memory a plurality of records in real time, each of the plurality of records including a timestamp and at least one data item obtained concurrently with the timestamp from among the proximate measurement data being obtained by each of the at least one measurement sensor subsystem; and transmitting at least one of the plurality of records from the local memory to the at least one primary computing environment.

15. The metering device of claim 14, wherein the transmitting of the at least one of the plurality of records is triggered by one or more of:
a request from the at least one primary computing environment;
a regular or random interval timer;
a local memory threshold alarm; and
availability of the network connecting the metering device and the at least one primary computing environment.

16. The metering device of claim 13, wherein the signal conditioning circuit further comprises a low pass filter coupled between the at least 3-axis passive multi-loop antenna and the electromagnetic field sensing meter such that the output signal generated by the at least 3-axis passive multi-loop antenna is passed through the low pass filter.

17. The metering device of claim 13, wherein the signal conditioning circuit further comprises a band pass filter coupled between the at least 3-axis passive multi-loop antenna and an electromagnetic measurement sensor subsystem such that the output signal generated by the at least 3-axis passive multi-loop antenna is passed through the band pass filter.

18. The system of claim 1, wherein the plurality of metering devices include metering devices that are fixed in position along the lossy conducting medium relative to the guided surface wave transmission source.

19. The system of claim 1, wherein the measurement data obtained by the at least one measurement sensor is obtained from points proximate to the metering devices at their fixed positions.

20. The system of claim 1, wherein the mobile metering device is deployed in a mobile vehicle.

* * * * *